(12) United States Patent
Kim et al.

(10) Patent No.: US 7,846,801 B2
(45) Date of Patent: Dec. 7, 2010

(54) METHOD OF FABRICATING SEMICONDUCTOR DEVICE

(75) Inventors: Sung-jun Kim, Hwaseong-si (KR); Seong-kyu Yun, Seoul (KR); Chang-ki Hong, Seongnam-si (KR); Bo-un Yoon, Seoul (KR); Jong-won Lee, Seongnam-si (KR); Ho-young Kim, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 674 days.

(21) Appl. No.: 11/833,050

(22) Filed: Aug. 2, 2007

(65) Prior Publication Data

US 2008/0045019 A1 Feb. 21, 2008

(30) Foreign Application Priority Data

Aug. 18, 2006 (KR) ...................... 10-2006-0078381

(51) Int. Cl.
*H01L 21/336* (2006.01)
(52) U.S. Cl. ...................... 438/296; 438/157; 438/261; 257/308; 257/E21.02
(58) Field of Classification Search ........................ None
See application file for complete search history.

(56) References Cited

FOREIGN PATENT DOCUMENTS

| JP | 05-218416 | 8/1993 |
|---|---|---|
| JP | 06-314739 | 11/1994 |
| JP | 11-054633 | 2/1999 |
| JP | 2002-016081 | 1/2002 |
| KR | 1020000016934 | 3/2000 |
| KR | 1020050078749 | 8/2005 |
| KR | 10200501016278 | 11/2005 |

OTHER PUBLICATIONS

English Abstract for Publication No. 05-218416.
English Abstract for Publication No. 06-314739.
English Abstract for Publication No. 11-054633.
English Abstract for Publication No. 1020000016934.
English Abstract for Publication No. 2002-016081.
English Abstract for Publication No. 1020050078749.
English Abstract for Publication No. 1020050106278.

*Primary Examiner*—Jarrett J Stark
(74) *Attorney, Agent, or Firm*—F. Chau & Associates, LLC

(57) ABSTRACT

Disclosed is a method of fabricating a semiconductor device including a multi-gate transistor. The method of fabricating a semiconductor device includes providing a semiconductor device having a number of active patterns which extend in a first direction, are separated by an isolation layer, and covered with a first insulating layer; forming a first groove by etching the isolation layer located between the active patterns adjacent to each other in the first direction; burying the first groove with a passivation layer; forming a second groove exposing at least a portion of both sides of the active patterns by etching the isolation layer located between the active patterns in a second direction intersecting the first direction; removing the passivation layer in the first groove; and forming a gate line filling at least a portion of the second groove and extending in the second direction.

19 Claims, 23 Drawing Sheets

METHOD OF FABRICATING SEMICONDUCTOR DEVICE

CROSS REFERENCE TO RELATED FOREIGN APPLICATIONS

This application claims priority from Korean Patent Application No. 10-2006-0078381 filed on Aug. 18, 2006 in the Korean Intellectual Property Office, the contents of which are herein incorporated by reference in their entirety.

BACKGROUND OF THE INVENTION

1. Field of the Invention

The present disclosure is directed to a method of fabricating a semiconductor device, and more particularly, to a method of fabricating a semiconductor device including a multi-gate transistor.

2. Description of the Related Art

The size of a semiconductor device has become smaller due to high performance and high integration of the Metal-Oxide-Semiconductor Field Effect Transistor (MOSFET). As the semiconductor device becomes smaller, a gate length is reduced. It is difficult for a traditional planar single gate transistor to overcome performance degradation of the device due to the reduction of gate length. A multi-gate transistor has been studied as an alternative to the planar single-gate transistor.

The multi-gate transistor uses an upper surface and both sides as a channel, while the planar single-gate transistor uses one surface as a channel. Therefore, the multi-gate transistor can improve current by more than three times compared to the existing transistors.

In order to form a multi-gate transistor, active patterns having three-dimensional structure should be provided. An active pattern having a three-dimensional structure may be achieved by removing an isolation layer formed in the vicinity thereof. However, in the case where the active pattern are separated due to the misalignment of mask patterns when the isolation layer between the active patterns is removed, undesired channels may be formed in the separated active patterns. For this reason, the reliability of the device may be reduced, and the semiconductor device may have malfunctioned.

SUMMARY OF THE INVENTION

A method of fabricating a semiconductor device according to one aspect of the invention includes providing a semiconductor device having a number of active patterns which extend in a first direction, are separated by an isolation layer, and covered with a first insulating layer, forming a first groove by etching the isolation layer located between the active patterns adjacent to each other in the first direction; burying the first groove with a passivation layer; forming a second groove exposing at least a portion of both sides of the active patterns by etching the isolation layer located between the active patterns in a second direction intersecting the first direction; removing the passivation layer in the first groove; and forming a gate line filling at least a portion of the second groove and extending in the second direction.

A method of fabricating a semiconductor device according to another aspect of the invention includes providing a semiconductor device having a number of active patterns which extend in a first direction, are separated by an isolation layer, and covered with a first insulating layer, forming a first groove by etching the isolation layer located between the active patterns adjacent to each other in the first direction; burying the first groove with a first passivation layer and a second passivation layer; forming a second groove exposing at least a portion of both sides of the active patterns by etching the isolating layer located between the active patterns in a second direction intersecting the first direction; removing the first passivation layer and the second passivation layer in the first groove; and forming a gate line filling at least a portion of the second groove and extending in the second direction.

BRIEF DESCRIPTION OF THE DRAWINGS

The above and other features will become more apparent by describing in detail exemplary embodiments thereof with reference to the attached drawings.

DESCRIPTION OF THE EXEMPLARY EMBODIMENTS

Figure 1:
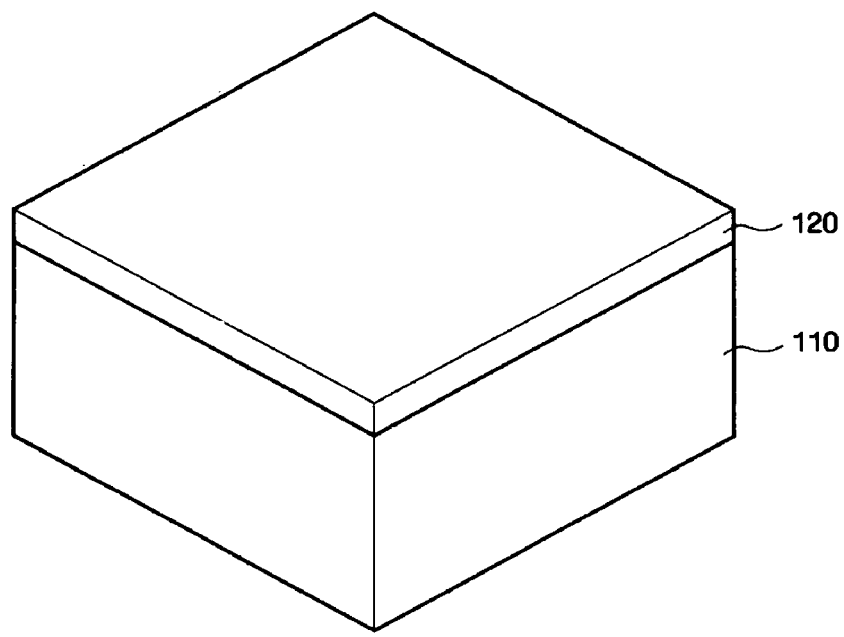
FIGS. 1 to 4, 5A, 6A, 7A, 8A, 9A, 10A, 11A, and 12A are perspective views illustrating a method of fabricating a semiconductor device according to one embodiment of the invention.

Features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specifications and drawing figures.

A method of fabricating a semiconductor device according to the invention may be applied to the semiconductor device including a highly integrated semiconductor device such as DRAM, SRAM, flash memory, FRAM, MRAM, PRAM or the like, an MEMS (Micro Electro Mechanical System) device, an optoelectronic device, a display device, a processor such as CPU, DSP or the like.

A method of fabricating a semiconductor device including a multi-gate transistor having an active pattern on which a channel is formed between two or more surfaces or between three surfaces will be disclosed herein below.

FIGS. 1 to 12C are perspective views and cross-sectional views illustrating a method of fabricating a semiconductor device according to one embodiment of the invention. FIGS. 1 to 4, 5A, 6A, 7A, 8A, 9A, 10A, 11A and 12A are perspective views illustrating a method of fabricating a semiconductor device according to one embodiment of the invention. FIGS.

5B, 6B, 7B, 8B, 9B, 10B, 11B and 12B are cross-sectional views taken along line B-B' of FIGS. 5A, 6A, 7A, 8A, 9A, 10A, 11A and 12A, respectively.

FIGS. 5C, 6C, 7C, 8C, 9C, 10C, 11C and 12C are cross-sectional views taken along line C-C' of FIGS. 5A, 6A, 7A, 8A, 9A, 10A, 11A, and 12A, respectively.

Referring to FIG. 1, first of all, a first insulating layer 120 is formed on a semiconductor substrate 110. For example, a silicon substrate may be used as the semiconductor substrate 110. The silicon substrate includes a p-type silicon layer or an n-type silicon layer. The silicon substrate may further include germanium other than silicon.

The first insulating layer 120 serves as a hard disk during a patterning of the semiconductor substrate 110 and prevents the surface of the semiconductor substrate 110 from being exposed to chemical substances during the following processes. An example of constituent materials of the first insulating layer 120 includes silicon nitride ($SiN_x$). For example, the first insulating layer 120 may be formed by LPCVD (Low Pressure Chemical Vapor Deposition), PECVD (Plasma Enhanced Chemical Vapor Deposition), or the like, but it is not limited to the above methods. In addition, even though not shown in drawings, a buffer layer (not shown) formed of an oxide layer (not shown) may be interposed between the semiconductor 110 and the first insulating layer 120.

Figure 2:
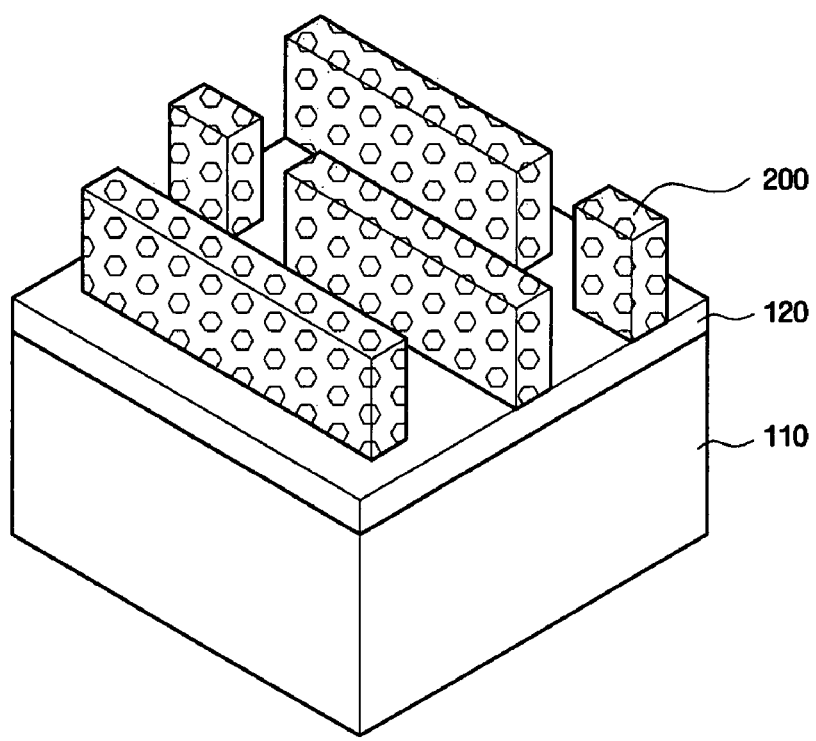

Referring to FIG. 2, a photoresist layer is formed on the first insulating layer 120. For example, the photoresist layer may be formed by a slit coating, a spin coating, or the like. Next, a photoresist pattern 200 defining an active pattern is formed by conducting an exposure and developing process using a photomask (not shown) defining the active pattern.

Figure 3:
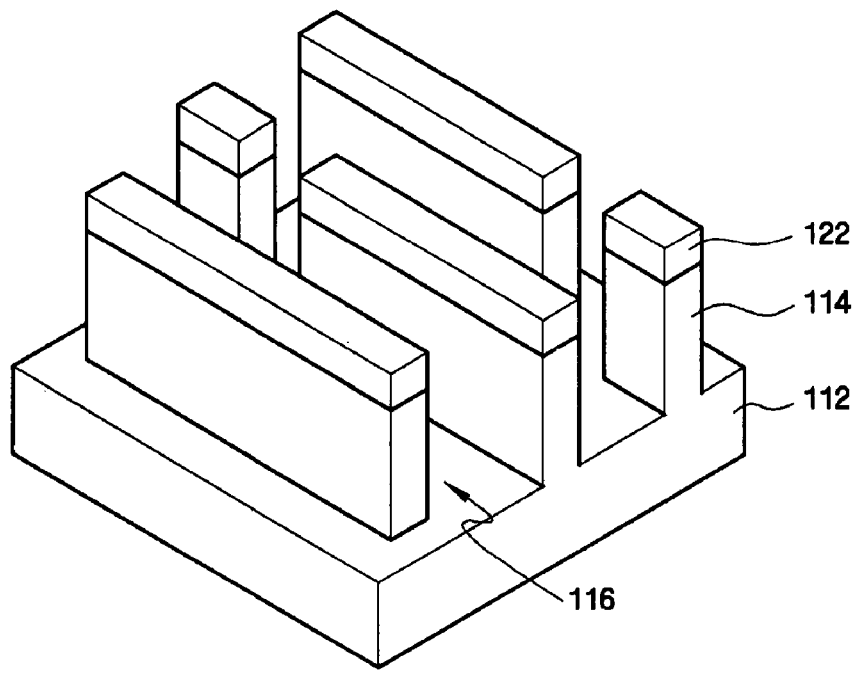

Referring to FIG. 3, the first insulating layer 120 is etched by using the photoresist pattern 200 as an etching mask. The surface of the semiconductor substrate 110 is exposed at a region where the first insulating layer 122 is removed. Subsequently, the semiconductor substrate 110 is etched by using the photoresist pattern 200 and/or the first insulating layer 120 as the etching mask. A trench 116 is formed by the etching of the semiconductor substrate 110, and a number of active patterns 114, which are surrounded by the trench 116 and extend in a first direction x, are formed at the same time. Next, the photoresist pattern 200 is removed. The photoresist pattern 200 may be removed right after the etching of the first insulation layer 120. In this case, the etching of the semiconductor 110 may be performed by using the first insulating layer 122 as the etching mask. Numeral reference '112' in FIG. 3 indicates a region of the semiconductor substrate at which the active patterns 114 are not formed.

Figure 4:
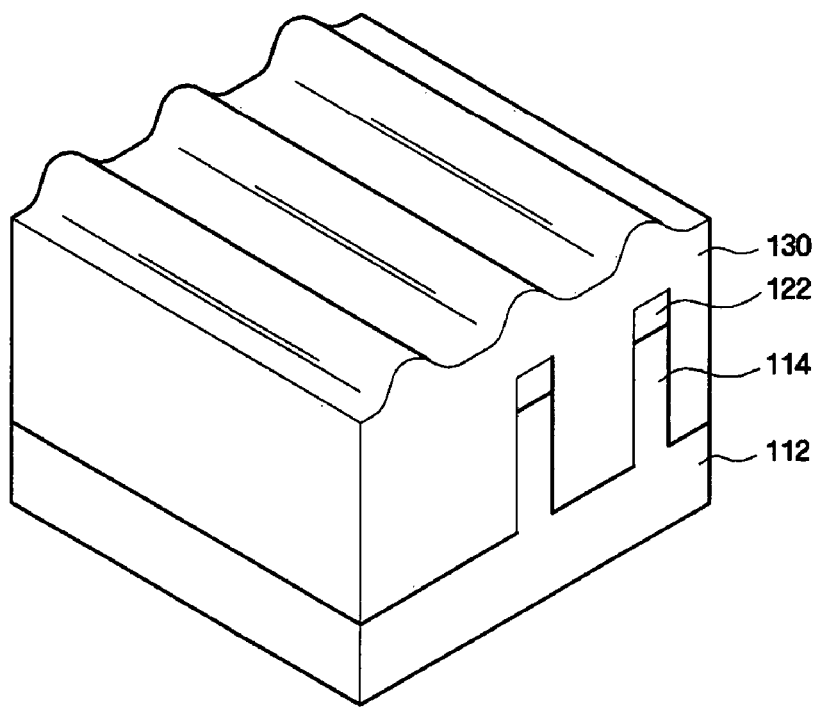

Referring to FIG. 4, an element separation insulating layer 130 filling the trench 116 is formed. The element separation insulating layer 130 is formed so as to have a margin for completely filling the trench 116. To be more specific, the element separation insulating layer 130 is formed so as to completely fill the trench 116 and to protrude from the surface of the first insulating layer 122 formed on the active pattern 114. The element separation insulating layer 130 to be formed may be an HDP (High Density Plasma) oxide layer deposited by using, for example, HDP. Even though not shown in drawings, an oxide layer (not shown) and/or nitride layer liner (not shown) may be further formed inside the trench 116 before the formation of the element separation insulating layer 130 so as to protect the active pattern 114.

Figure 5A:
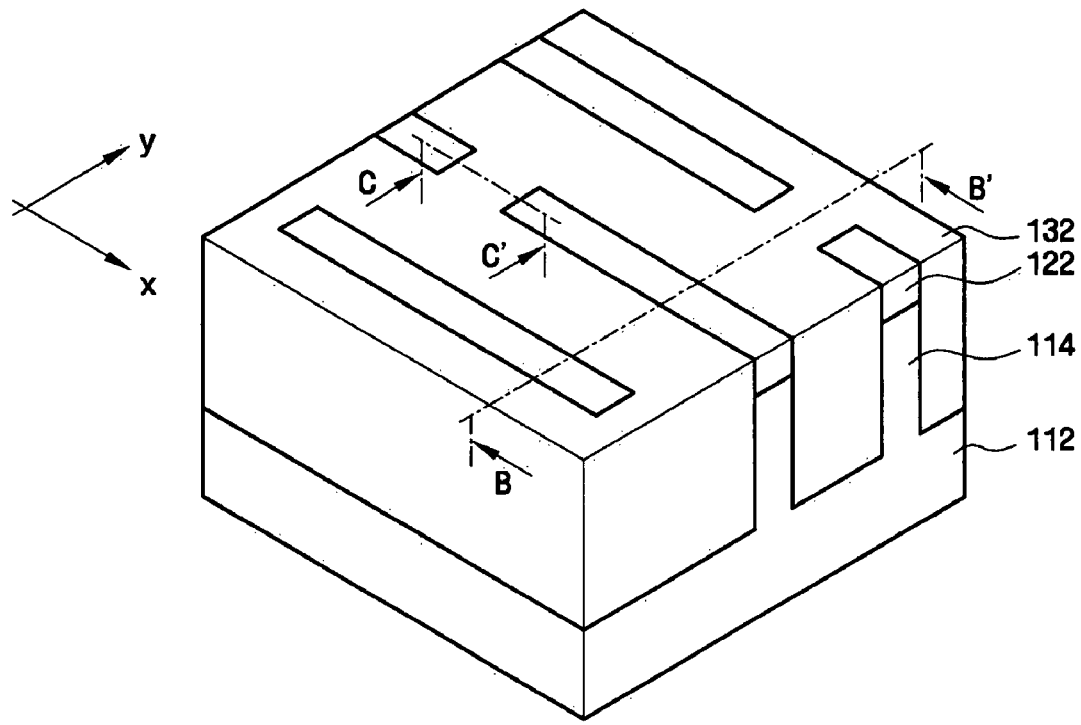
Figure 5B:
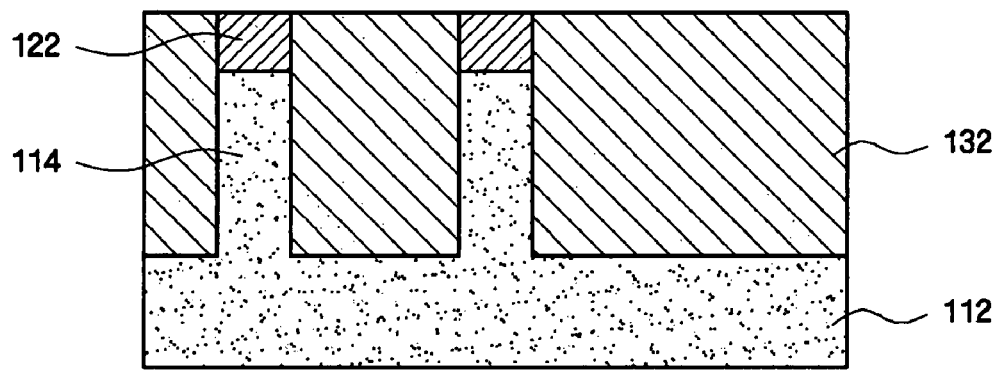
FIGS. 5B, 6B, 7B, 8B, 9B, 10B, 11B, and 12B are cross-sectional views taken along line B-B' of FIGS. 5A, 6A, 7A 8A, 9A, 10A, 11A, and 12A, respectively.
Figure 5C:
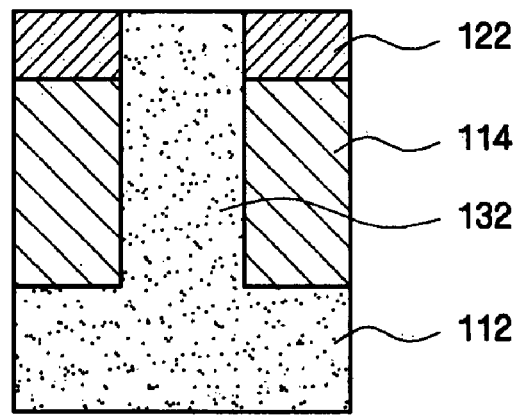
FIGS. 5C, 6C, 7C, 8C, 9C, 10C, 11C, and 12C are cross-sectional views taken along line C-C' of FIGS. 5A, 6A, 7A, 8A, 9A, 10A, 11A, and 12A, respectively.

Referring to FIGS. 5A to 5C, the surface of the protruding element separation insulating layer 130 is polished to be planarized. For example, the element separation insulating layer 130 is polished by a CMP (Chemical Mechanical Polishing) process using a polishing slurry. The first insulating layer 122 may act as a polishing stop layer, and an upper surface of the first insulating layer 122 may be exposed after the polishing. As a result of the polishing, an isolation layer 132 is completed. As can be seen from FIGS. 5A to 5C, the upper surface of the isolation layer 132 has a plane substantially congruent to the upper surface of the first insulating layer 122. The upper surface of the first insulating layer 122 is formed so as to extend in parallel to each other in the first direction x, and a number of the first insulating layers 122 are separated from each other on the respective extended line. Here, the upper surface of the first insulating layer 122 has a shape substantially congruent to the lower active pattern 114.

Figure 6A:
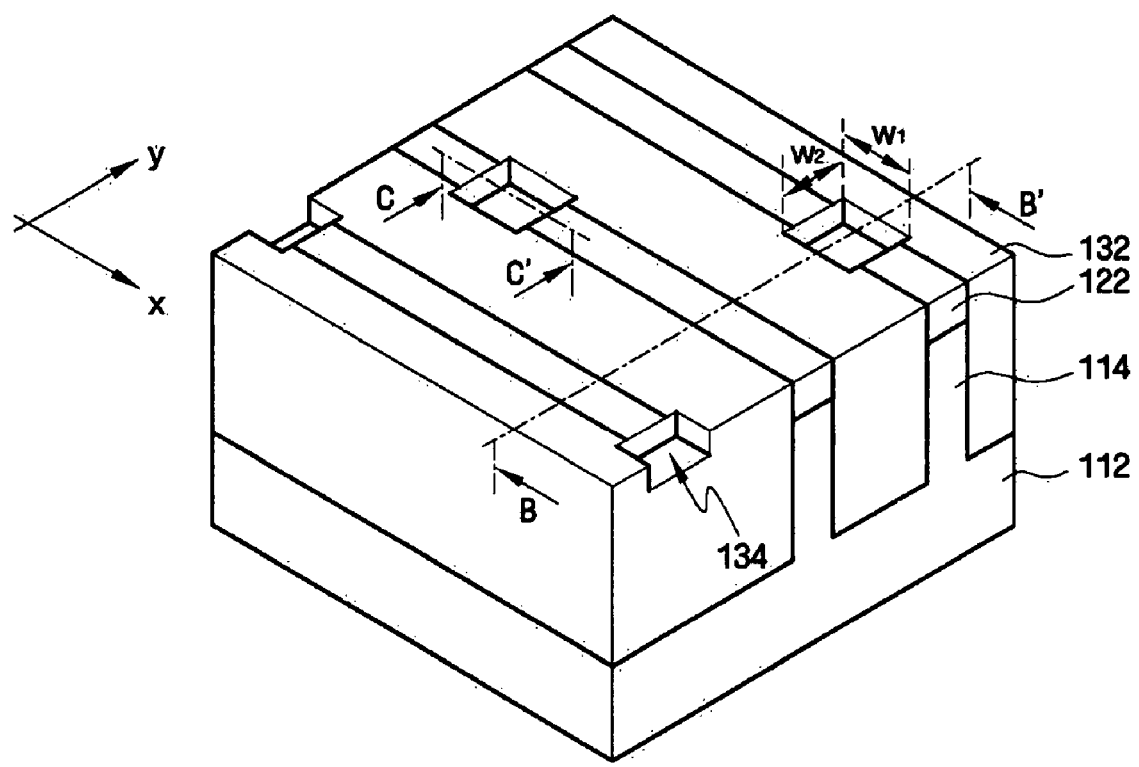
Figure 6B:
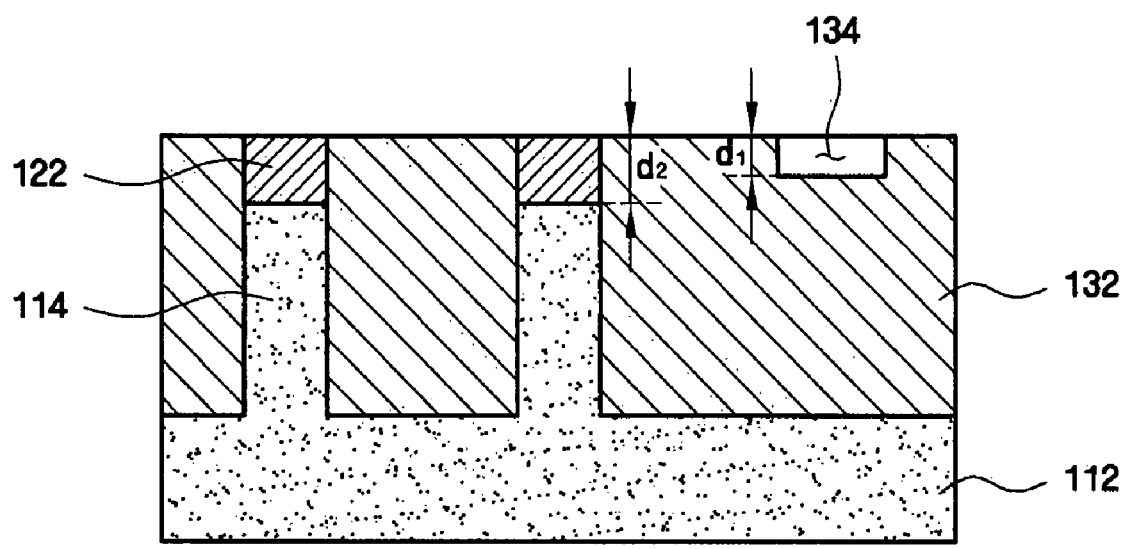
Figure 6C:
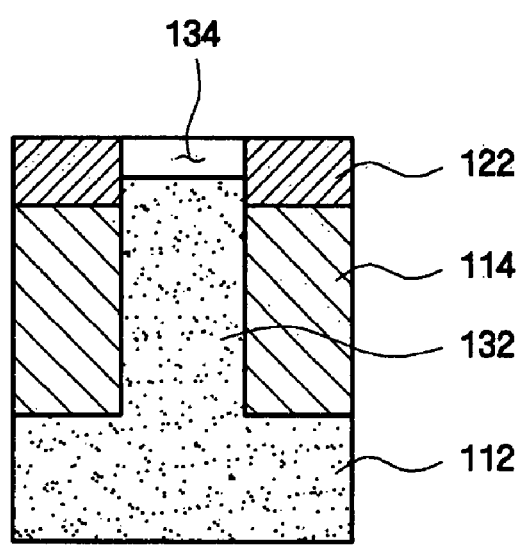

Referring to FIGS. 6A to 6C, a first groove 134 is formed by etching the isolation layer 132, located between the neighboring active patterns 114 along the extended line in the first direction x separated from each other. At this time, the photoresist pattern (not shown) is used as the etching mask. The upper surface of the isolation layer 132, located between the active patterns 114 in the first direction x, may be entirely etched. Therefore, a width $w_1$ of the first groove 134 in the first direction x is equal to the distance between the active patterns 114 in the first direction x. A width $w_2$ of the first groove 134 in a second direction y is equal to a width of the active pattern 114 in the second direction y or is wider than the width of the active pattern 114 in the second direction y so as to have a predetermined margin. That is, the upper surface of the isolation layer 132, which is located between the active patterns 114 in the first direction x, may be entirely etched.

A depth $d_1$ of the first groove 134 may be formed so as to be smaller than a thickness $d_2$ of the first insulating layer 122. If the depth $d_1$ of the first groove 134 is less than the thickness $d_2$ of the first insulating layer 122, as can be seen from FIGS. 6B and 6C, the active pattern 114 is not exposed to the first groove 134. That is, a side wall of the first groove 134 is provided with the first insulating layer 122 and the isolation layer 132, and a bottom of the first groove 134 is provided with the isolation layer 132. By the above-described configuration, the active pattern 114 is protected during the following removal process.

Figure 7A:
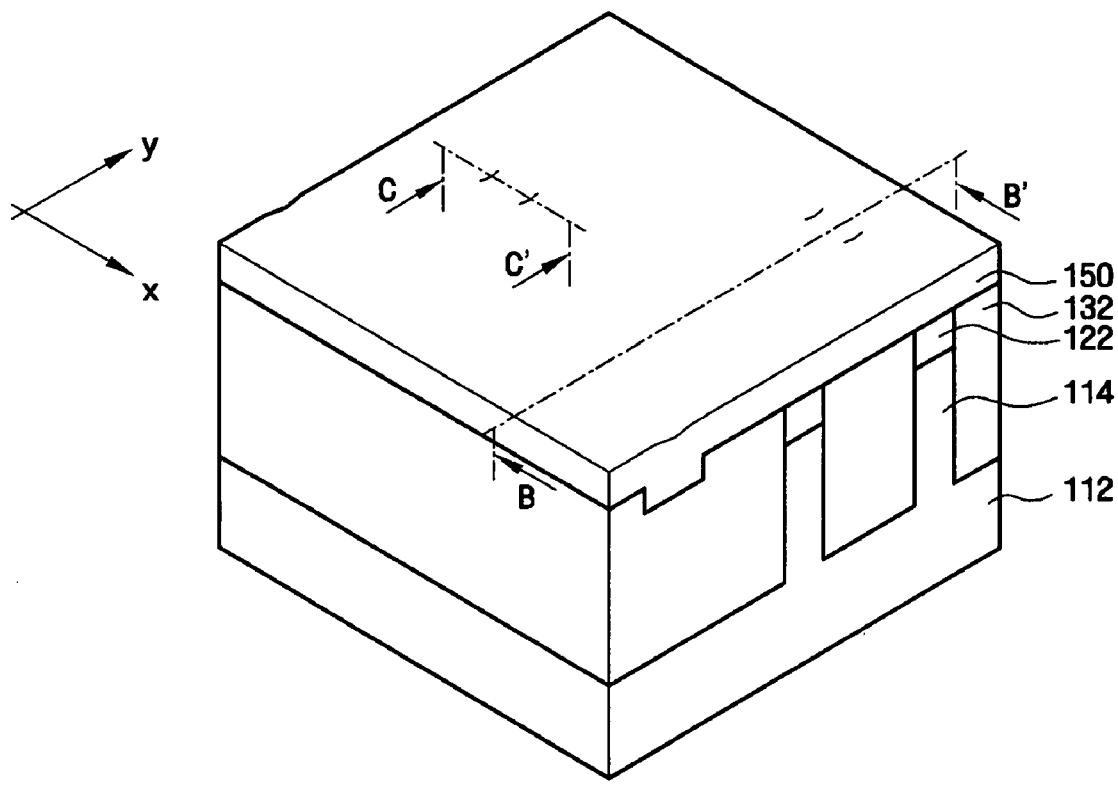
Figure 7B:
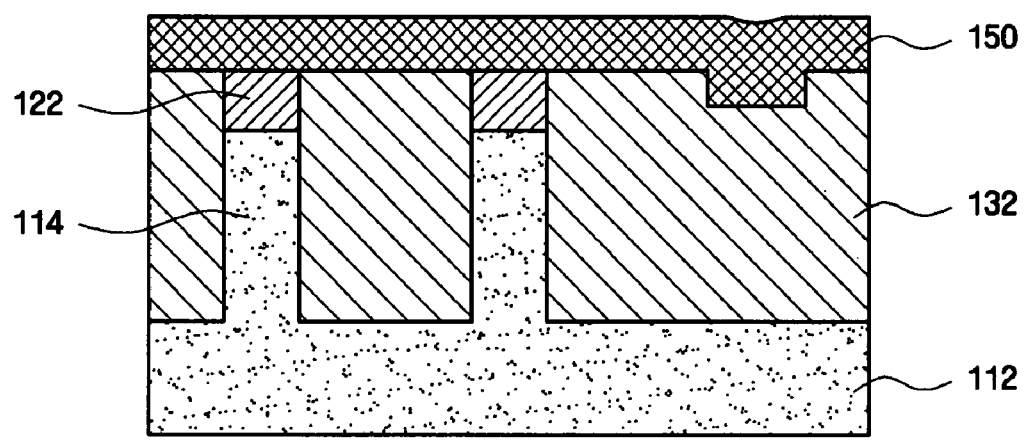
Figure 7C:
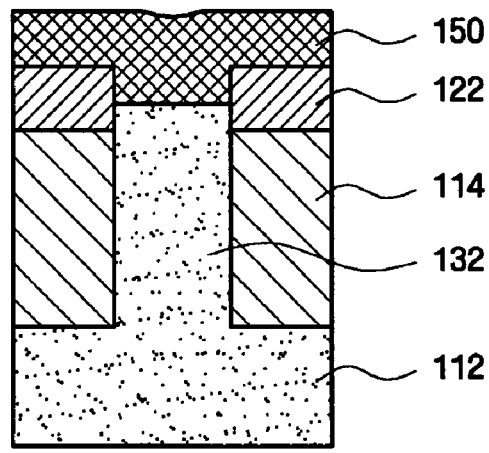

Referring to FIGS. 7A to 7C, a passivation material layer 150 is formed on the resultant formed by the above described process. The passivation material layer 150 fills at least a portion of the first groove 134 so as not to expose the isolation layer 132 forming the bottom of the first groove 134. Considering the process margin, the first groove 134 may be entirely filled. In this case, the upper surface of the semiconductor substrate 112 and 114 may be entirely covered with the passivation material layer 150.

Examples of materials forming the passivation material layer 150 include polysilicon, silicon nitride, silicon oxynitride or the like. The polysilicon may be used.

Figure 8A:
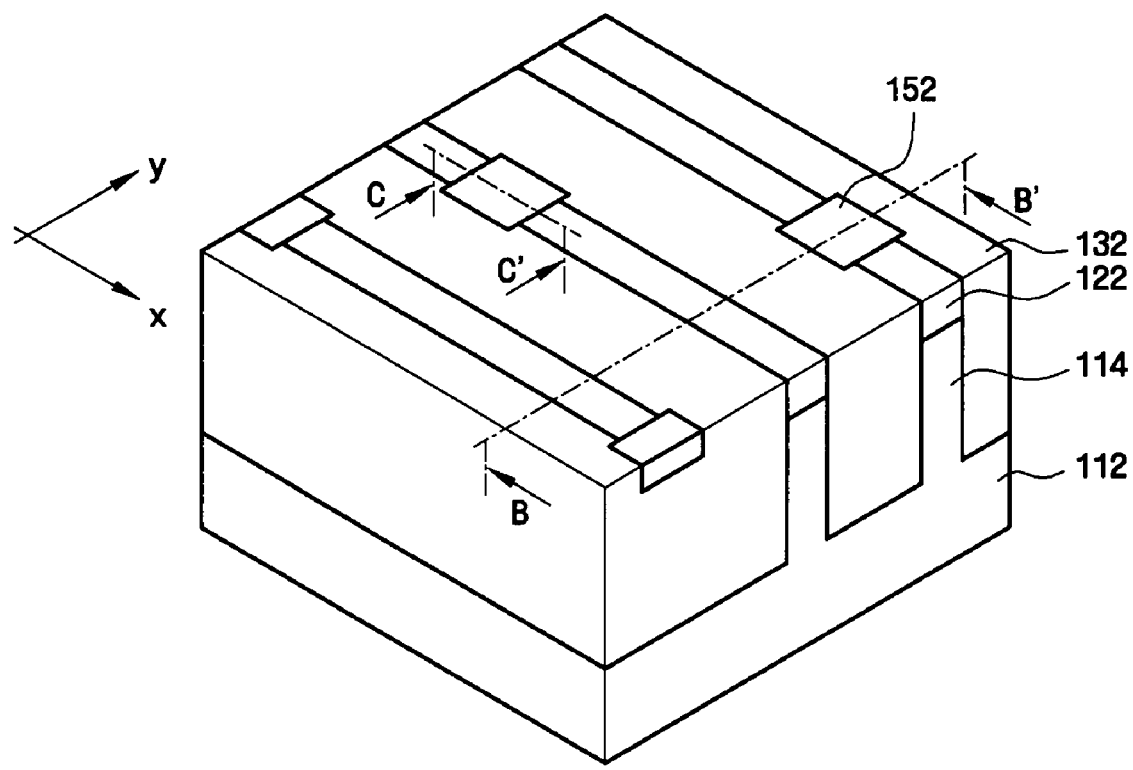
Figure 8B:
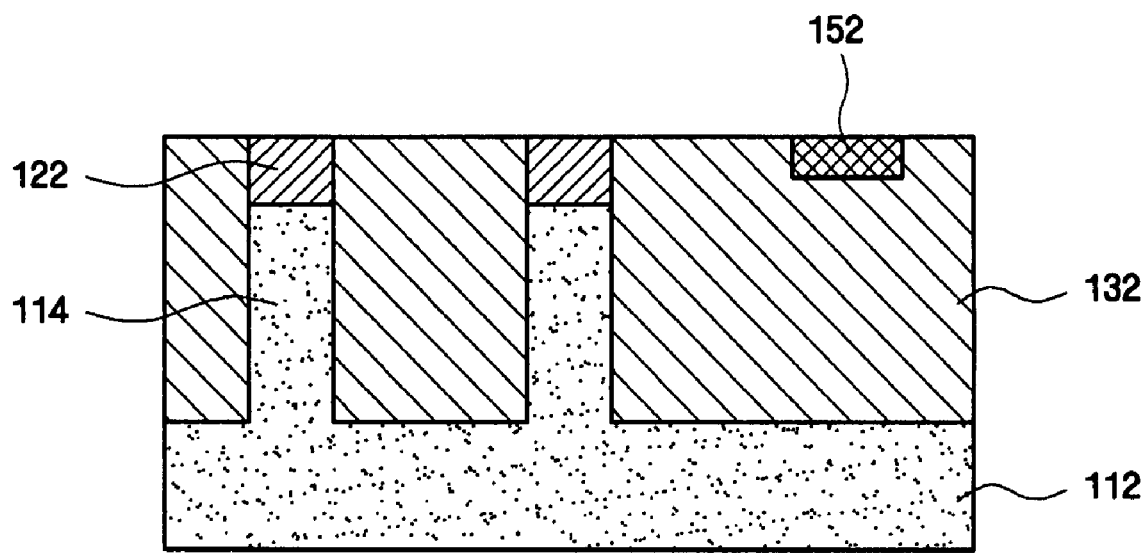
Figure 8C:
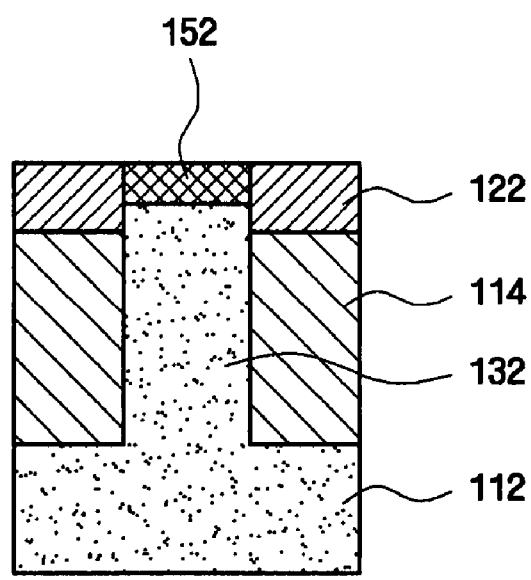

Referring to FIGS. 8A to 8C, the surface of the passivation material layer 150 is polished to be planarized. The polishing of the passivation material layer 150 is accomplished by, for example, a chemical mechanical polishing process. The polishing stop layer may be the isolation layer 132 and/or the first insulating layer 122. That is, a slurry is applied to the chemical mechanical polishing process. The slurry has a polishing rate of the passivation material layer 150 greater than that of the isolation layer 132 and the first insulating layer 122. The passivation material layer may be polished to be planarized until the isolation layer 132 and the first insulating layer 122 are completely exposed. As a result of the planarization, a passivation layer 152 is buried in the first groove 134.

Figure 9A:
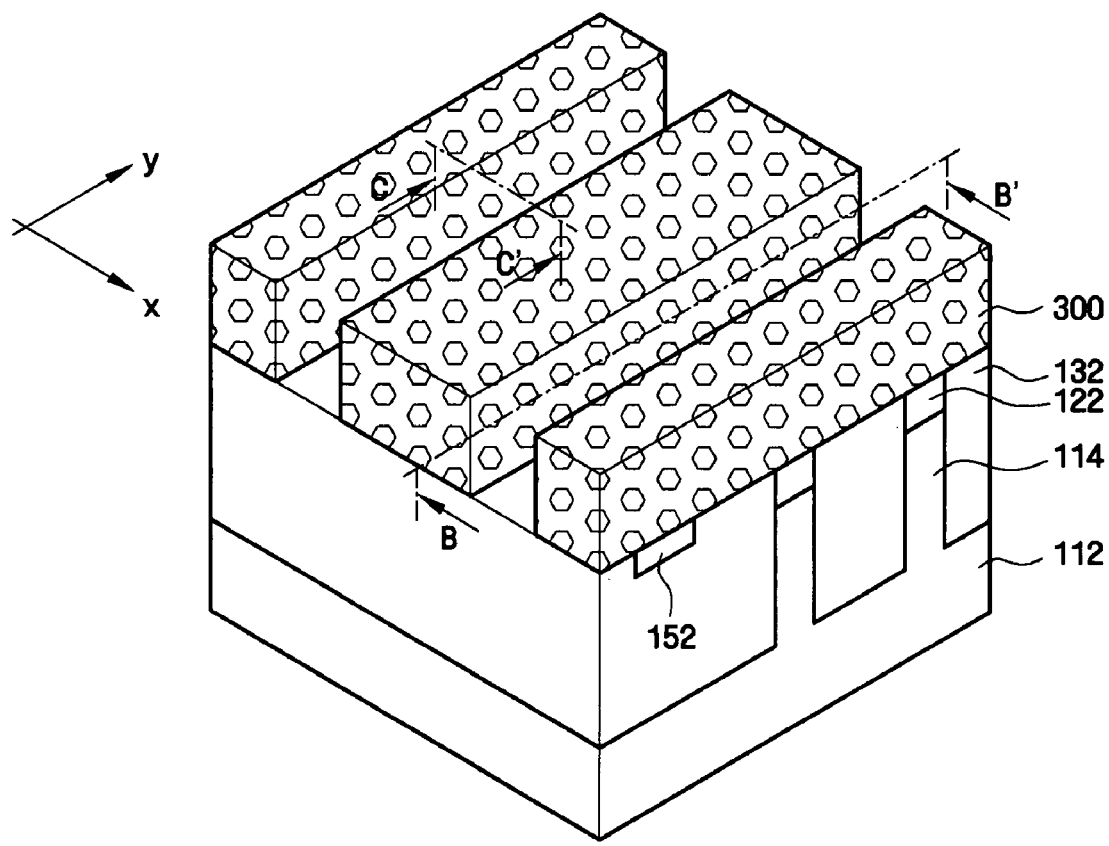
Figure 9B:
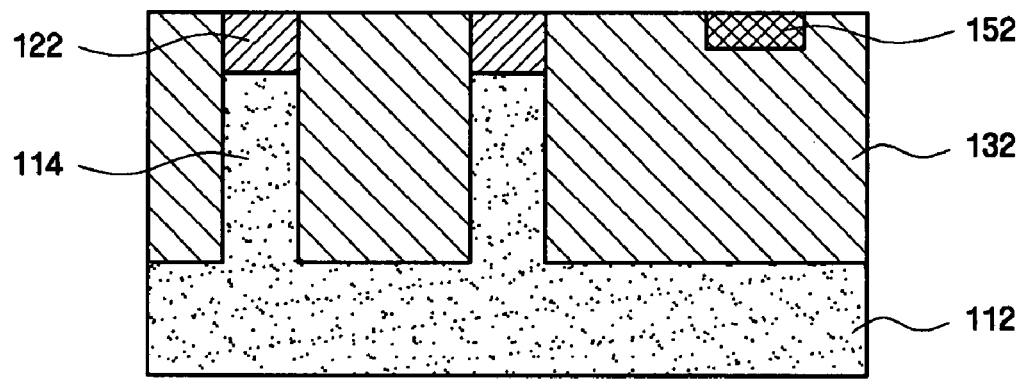
Figure 9C:
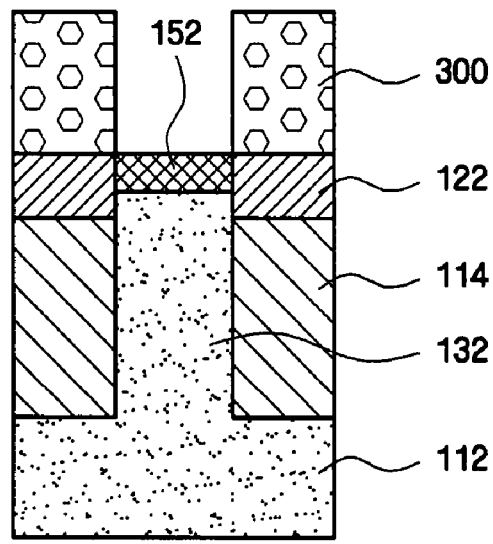

Referring to FIGS. 9A to 9C, a photoresist pattern 300 having an exposed region is formed in the second direction y intersecting the first direction x. The photoresist pattern 300 may be formed by the exposure and developing processes using the photomask (not shown). At this time, a process for correctly aligning the photomask is accompanied. Since the photoresist pattern 300 to be transferred forms a line pattern, the photomask has only to be aligned in one direction. That is, since the photomask is aligned on the one dimensional line, the alignment of the photomask is easier than two-dimensional alignment.

The exposed region of the photoresist pattern 300 includes the region where the passivation layer 152 buried in the first groove 134 is formed, and at least a portion of the exposed region is overlapped with the region in which a following gate line is formed. For example, the shape of the exposed region may be substantially congruent to that of the region in which the gas line is formed.

Figure 10A:
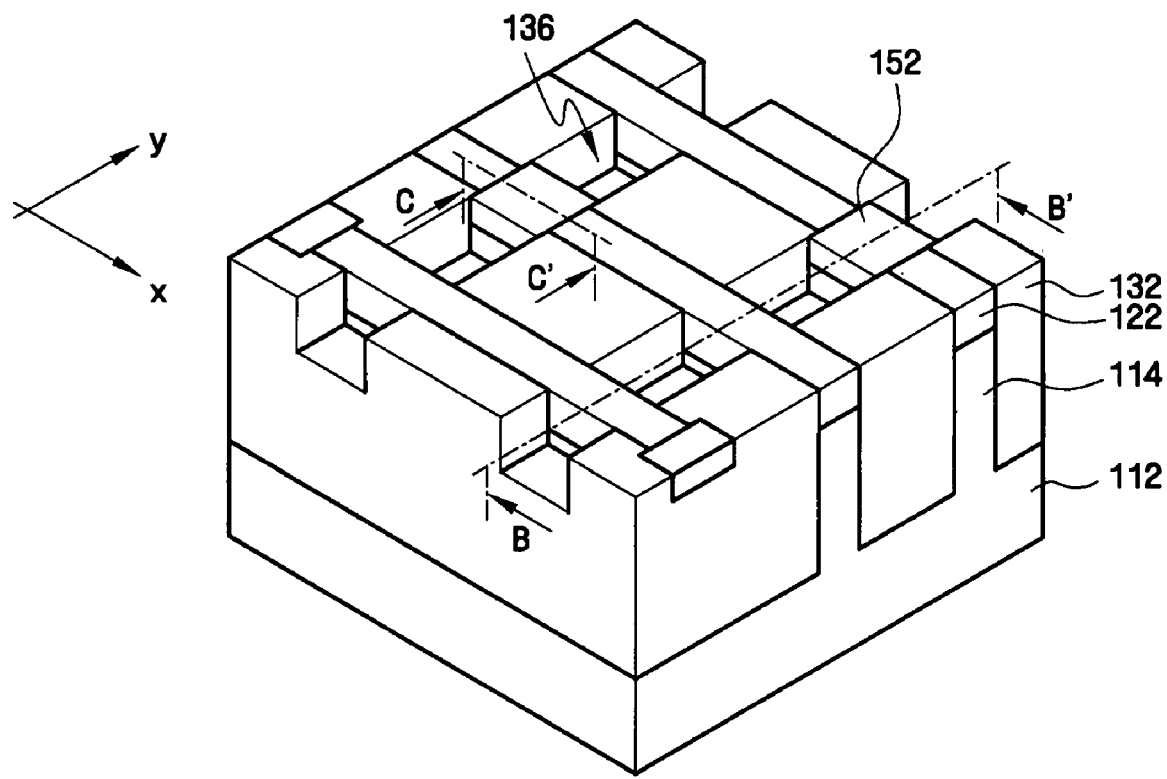
Figure 10B:
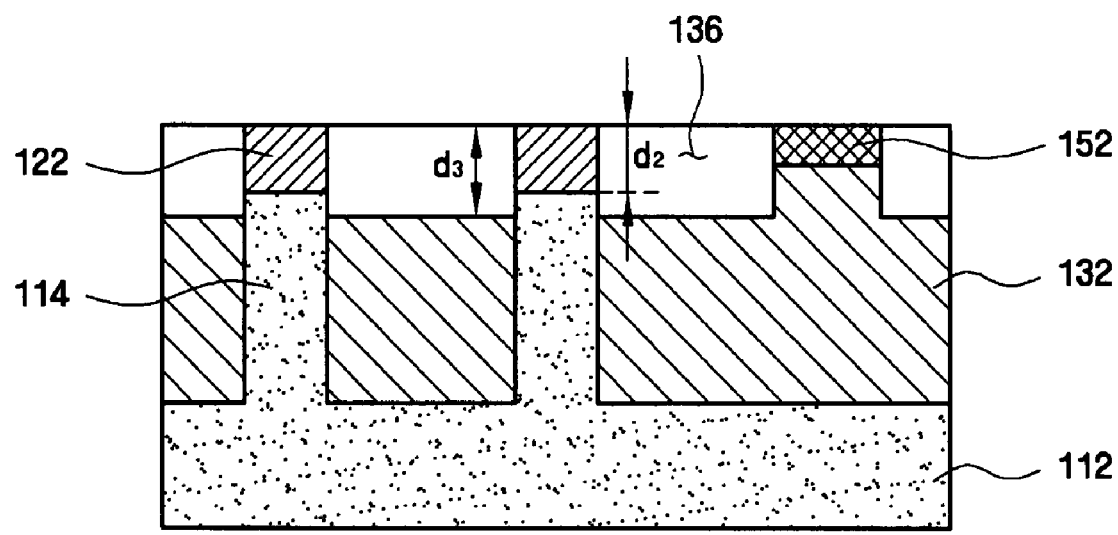
Figure 10C:
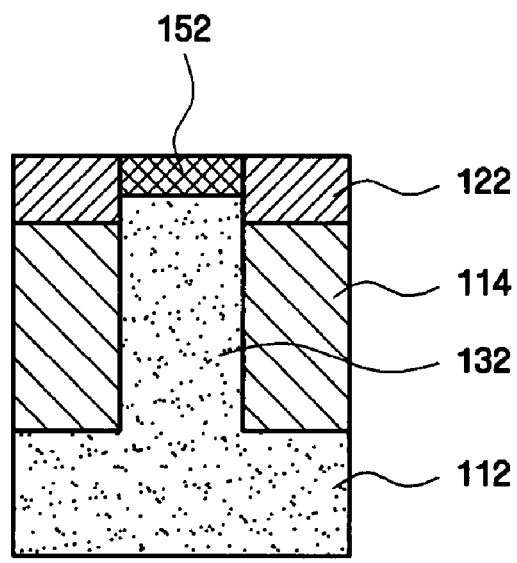

Referring to FIGS. 10A to 10C, the exposed region of the photoresist pattern 300 is etched by using the photoresist pattern 300 as the etching mask. The upper surface of the semiconductor substrates 112 and 114 exposed by the exposed region of the photoresist pattern 300 includes the first insulating layer 122, the isolation layer 132 located between the active patterns 114 arranged in parallel to each other, and the passivation layer 152 buried in the first groove 134. Here, the first insulating layer 122 is formed of, for example, a silicon nitride, and the passivation layer 152 is formed of, for example, silicon-based materials. In addition, the isolation layer 132 is formed of, for example, and HDP oxide layer. Therefore, in the case of conducting a dry etching and wet etching by using an etching gas or etchant having an etching rate of the oxide layer greater than the etching rate of the silicon nitride and the silicon-based material, only the isolation layer 132 of the exposed region may be selectively etched. In addition, since the passivation layer 152 is not etched, even though a portion of the photomask (not shown) may be misaligned, the side of the active pattern 114 located at both sides of the passivation layer 152 is not exposed. Accordingly, the formation of an undesired channel in the active patterns 114 adjacent to each other due to the side exposure of the active patterns 114 located at both sides of the passivation layer 152 after a gate line forming process may be prevented. That is, the active patterns 114 may be completely separated.

The ratio between the etching rate of the etching gas or etchant of the oxide layer and the etching rate of the etching gas or etchant of the silicon-based material is, for example, 5:1 or more, and may be 10:1 or more.

A second groove 136 is formed by selectively etching the isolation layer 132 located between the active patterns 114 in the second direction y. For example, the depth $d_3$ of the second groove 136 may be larger than the thickness $d_2$ of the first insulating layer 122. Accordingly, at least a portion of both sides of the active patterns 114 adjacent to each other is exposed by the second groove 136. That is, the side wall of the second groove 136 may be formed with the side surface of the isolation layer 132 and the active patterns 114.

In addition, one side of the second groove 136 may be formed with the upper passivation layer 152 and the lower isolation layer 132 in the passivation layer 152 forming region.

Next, the photoresist pattern 300 is removed.

Figure 11A:
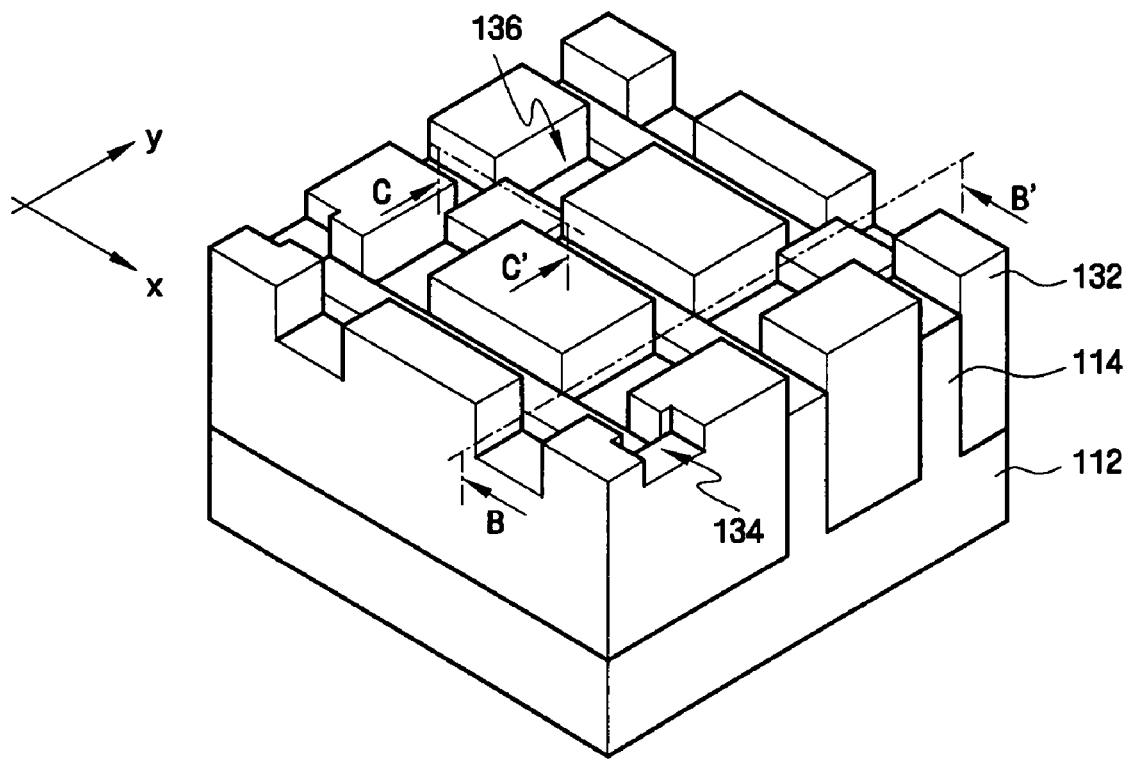
Figure 11B:
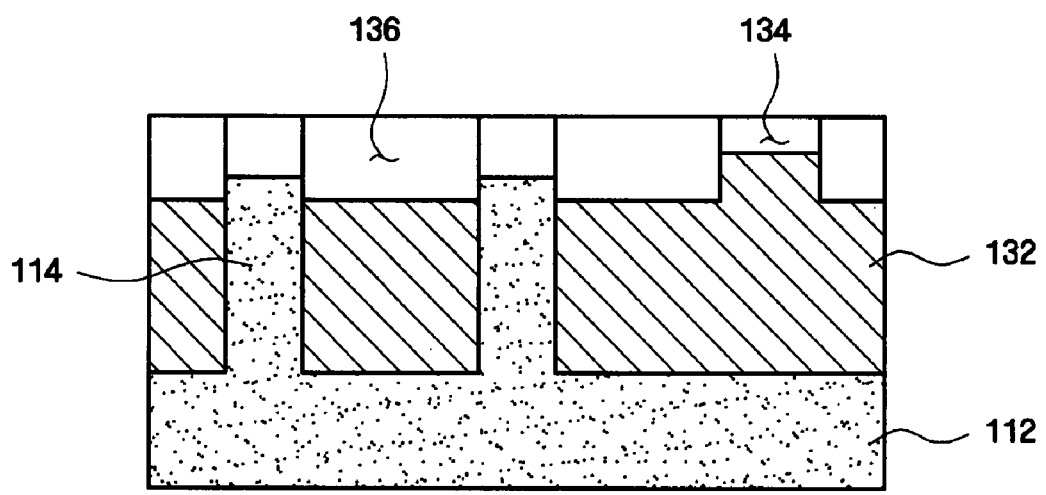
Figure 11C:
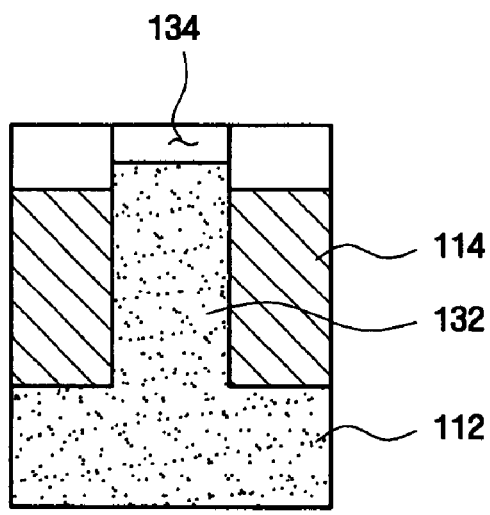

Referring to FIGS. 11A to 11C, the passivation layer 152 buried in the first groove 134 is removed. The upper surface of the semiconductor substrates 112 and 114 includes the first insulation layer 122, the isolation layer 132, and the passivation layer 152. When the first insulating layer 122 is formed on the silicon nitride, the isolation layer 132 is formed on the HDP oxide layer, and the passivation layer 152 is formed of the polysilicon. If the etching gas or etchant having a relatively greater etching rate to the polysilicon is used, it is possible to selectively remove only the passivation layer 152. However, the upper surface of the active pattern 114 is protected by the first insulating layer 122, but at least a portion of both sides of the active pattern 114 is exposed through the second groove 136. Therefore, in order to prevent an attack of the active pattern 114 in the step, an anisotropic etching may be applied. The anisotropic etching may be performed by the dry etching process.

When the material forming the passivation layer 152 and the active pattern 114 are different from each other, if the etching selectively of the etching gas or etchant to the passivation layer 152 and the active pattern 114 is different, the etching gas or etchant having the greater etching selectively may be used in the dry etching process and the wet etching process. In this case, an isotropic etching as well as the anisotropic etching may be applied. For example, when the passivation layer 152 is formed of polysilicon containing the impurity, and the active pattern 114 is formed of silicon, the etching may be conducted by using the etching gas or etchant having the greater etching selectivity to the passivation layer 152 and the active pattern 114. The polysilicon containing the impurity may be formed in such a manner that the impurity is added to the polysilicon by depositing the polysilicon on the stack of the passivation layer 152 through an in-situ process under an atmosphere having the impurity, and the polysilicon containing the impurity may be formed by doping the impurity ion after the deposition of the polysilicon.

As a modified example of the embodiment, the active pattern 114 may be protected by oxidizing the exposed side surface of the active pattern 114 before the etching process. That is, the attack of the active pattern during the removal process of the passivation layer 152 may be prevented by forming the oxide layer (not shown) at the side surface of the active pattern 114 forming the side wall of the second groove 136. In this case, since the oxide layer is not formed on the upper surface of the active pattern 114, the oxide process is required during the formation of the gate line. However, when the oxide layer is formed before the formation of the first insulating layer, the oxide layer is formed on the upper surface of the active pattern 114. Therefore, the oxide process may be omitted during the formation of the gate line.

As another modified example of the embodiment, the photoresist pattern (not shown) may be used as the etching mask during the etching process. The photoresist pattern covers at least the exposed side surface of the active pattern 114 to prevent the attack during the etching process.

As described above, when the exposed side surface of the active pattern 114 is protected by the oxide layer or the photoresist pattern, both the anisotropic etching and the isotropic etching may be applied. Accordingly, the passivation layer 152 may be removed by a dry etching and a wet etching process.

In the removal of the passivation layer 152 buried in the first groove 134, the side wall of the first groove 134 is formed with the first insulation layer 122 and the isolation layer 132, and the bottom surface of the first groove 134 is formed with the isolation layer 132. Therefore, it has no influence on the active pattern 114.

Next, the first insulating layer 122, which is formed at the surface of the active pattern 114, is removed. When the first insulating layer 122 is formed of the silicon nitride, the first insulating layer 122 may be removed by the dry etching process or the wet etching process using the etching gas or etchant having the highly selective etching rate to the silicon nitride.

Figure 12A:
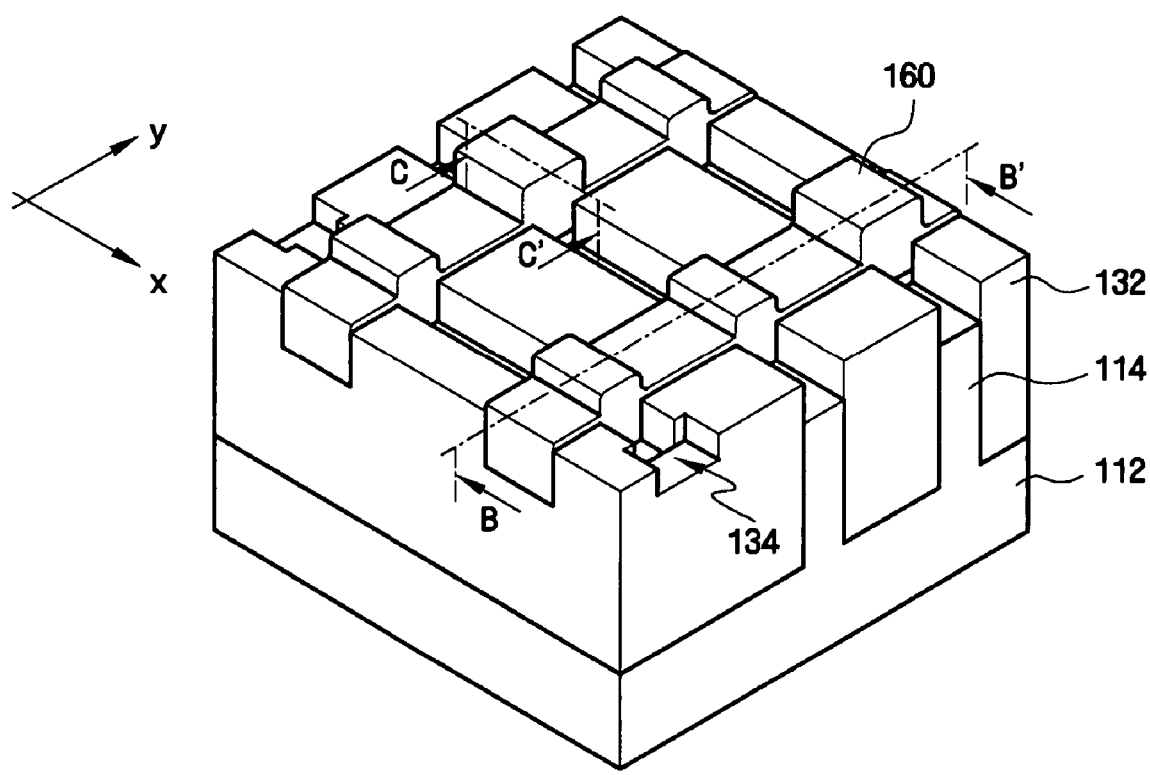
Figure 12B:
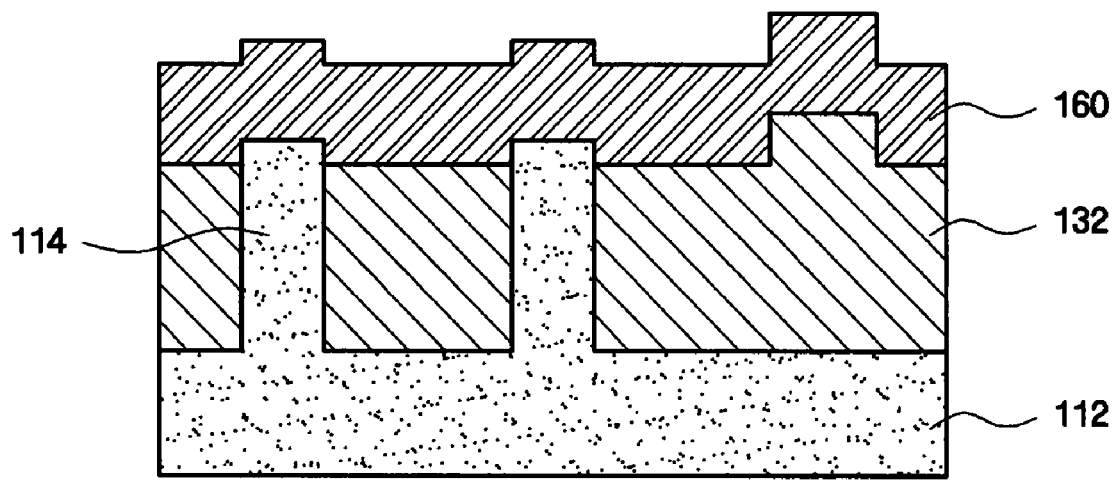
Figure 12C:
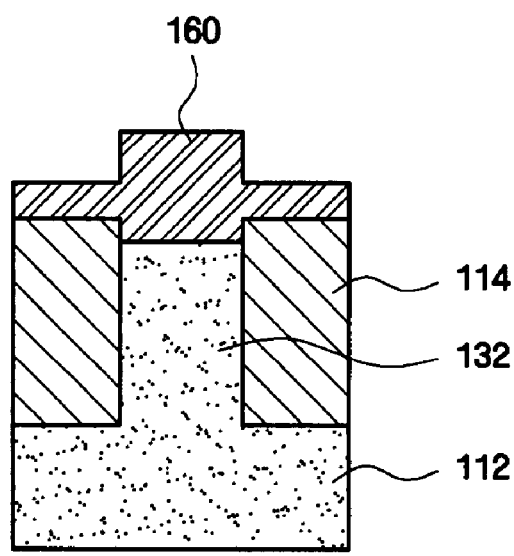

Referring to FIGS. 12A to 12C, the active pattern 114 is oxidized, and the oxide layer (not shown) is formed on the surface of the active pattern. A gate conductive layer (not shown) is formed on the entire surface of the resultant. Next, the photoresist pattern (not shown), which defines the expanded gate line 160 in the second direction y, is formed on the gate conductive layer. The shape of the above photoresist pattern is substantially complimentary to the shape of the photoresist pattern (referred to as '300' in FIGS. 9A to 9C) used to pattern the second groove 136. That is, the region covered with the photoresist pattern in FIGS. 9A to 9C is exposed in FIGS. 12A to 12C, and the region exposed in FIGS. 9A to 9C is covered in FIGS. 12A to 12C. As described above, the photoresist patterns having the complementary shape may be formed by using the same photomask. That is, the photoresist patterns having the complementary shape may be formed by using a positive photoresist layer and a negative photoresist layer with the same photomask.

Then, a gate line 160 is formed by etching the gate conductive layer using the photoresist pattern as the etching mask. The gate line 160 extends in the second direction to be buried in the second groove 136. Since the height of the second groove 136 formed at both sides of the active pattern 114 is less than that of a perimeter thereof, the gate line 160 is formed across the active pattern 114. Accordingly, the channel region may be formed at both the upper surface and both sides of the active pattern 114. For this reason, the multi-gate transistor having an improved characteristic may be formed.

The remaining processes, which form a source region and a drain region by implanting the ion to complete the formation of the transistor and forms a local wiring line, are know to those skilled in the art, and thus its detailed description will be omitted.

Hereinafter, a method of fabricating a semiconductor device according to another embodiment of the invention will be described with reference to FIGS. 13A to 18A. FIGS. 13A, 14A, 15A, 16A, 17A and 18A are perspective views illustrating a method of fabricating a semiconductor device according to another embodiment of the invention. FIGS. 13B, 14B, 15B, 16B, 17B, and 18B are cross-sectional views taken along line B-B' of FIGS. 13A, 14A, 15A, 16A, 17A, and 18A, respectively. FIGS. 13C, 14C, 15C, 16C, 17C, and 18C are cross-sectional views taken along line C-C' of FIGS. 13A, 14A, 15A, 16A, 17A, and 18A, respectively. Like reference numerals in the drawings denote like elements, and thus their description will be omitted or be simplified.

Figure 13A:
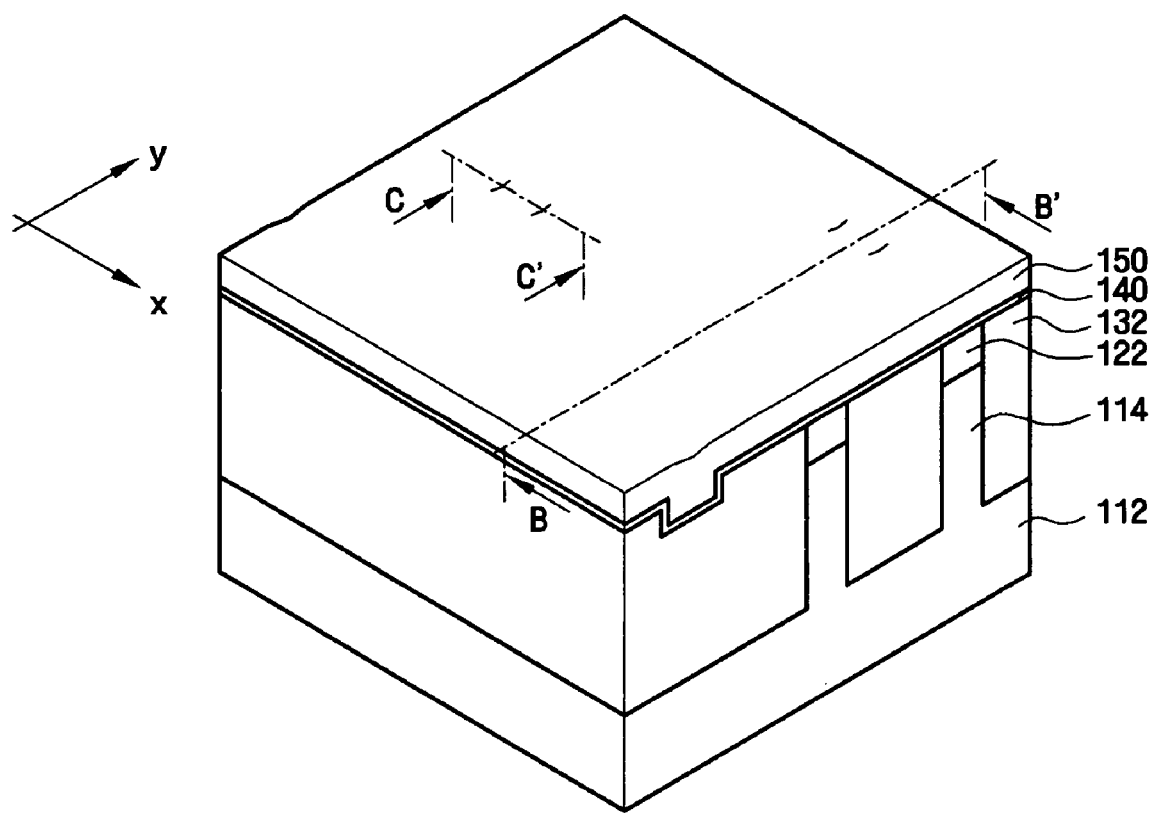
FIGS. 13A, 14A, 15A, 16A, 17A, and 18A are perspective views illustrating a method of fabricating a semiconductor device according to another embodiment of the invention.
Figure 13B:
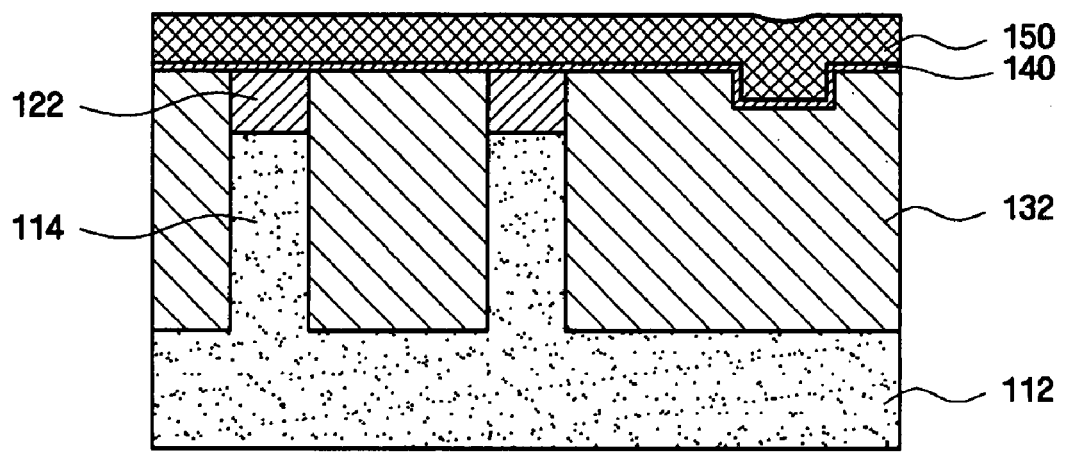
FIGS. 13B, 14B, 15B, 16B, 17B, and 18B are cross-sectional views taken along line B-B' of FIGS. 13A, 14A, 15A, 16A, 17A, and 18A, respectively.
Figure 13C:
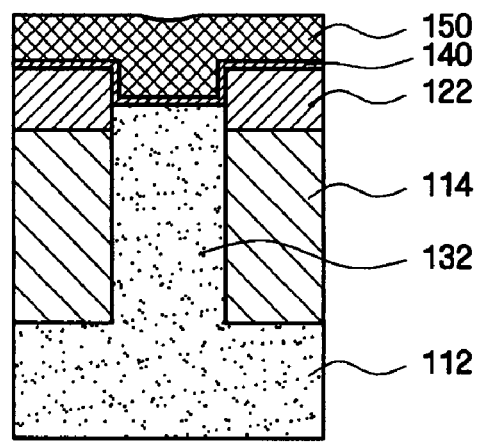
FIGS. 13C, 14C, 15C, 16C, 17C, and 18C are cross-sectional views taken along line C-C' of FIGS. 13A, 14A, 15A, 16A, 17A and 18A, respectively.

Referring to FIGS. 13A to 13C, a method of fabricating the semiconductor device according to this embodiment of the invention is the same as the method according to other embodiment of the invention until the first groove 134 (not shown in FIGS. 13A to C) is formed. Next, a first passivation material layer 140 and a second passivation material layer 150 are sequentially formed on semiconductor substrates 112 and 114 on which the first groove 134 is formed. For example, the first passivation material layer 140 may be formed of a silicon nitride. The first passivation layer 140 may be formed so as to have a thickness smaller than a depth of the first groove 134. That is, the first passivation material layer 140 is formed so as not to entirely fill the first groove 134.

The second passivation material layer 150 may be formed of a polysilicon substantially identical to the material forming the passivation material layer according to an embodiment of the invention. The second passivation material layer 150 is formed so as to entirely fill the first groove 134, which is partially filled with the first passivation material layer. As a result, the upper surface of the semiconductor substrates 112 and 114 is fully covered with the second passivation layer 150.

Figure 14A:
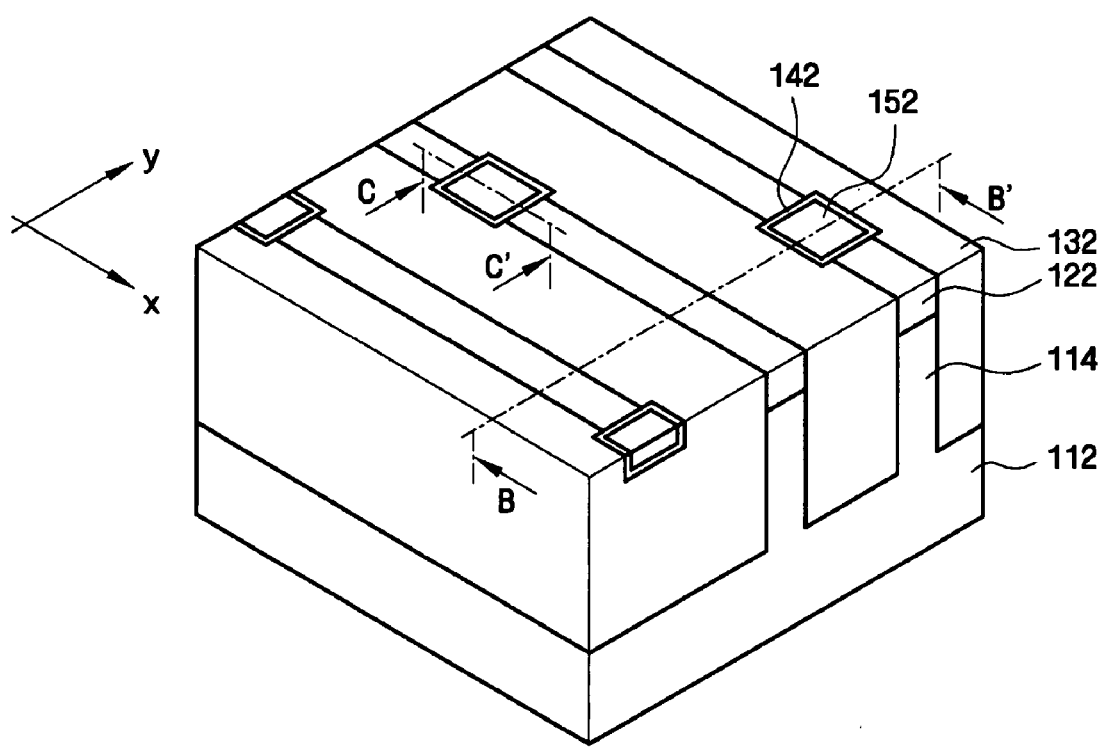
Figure 14B:
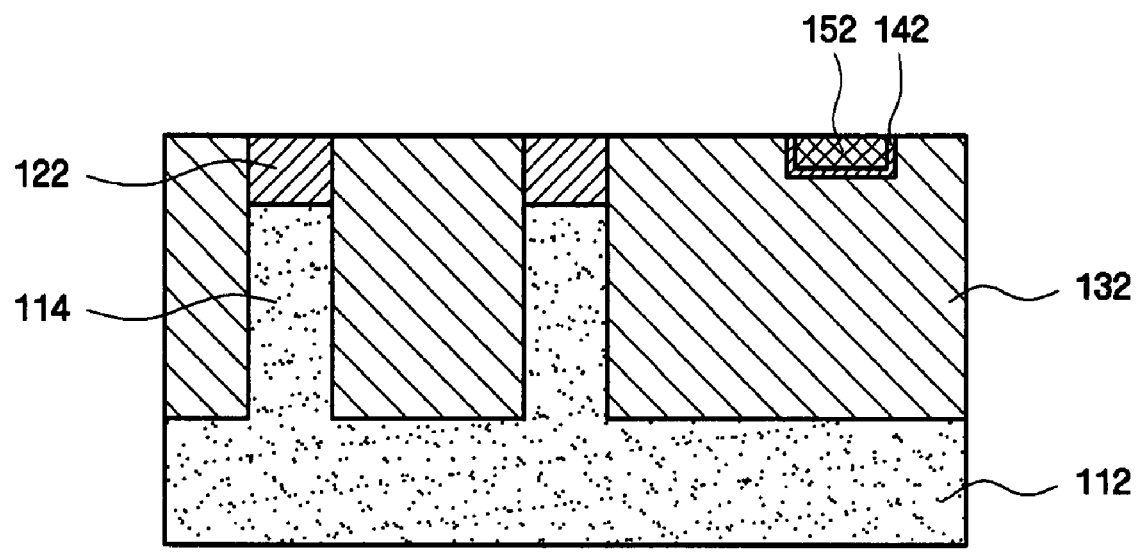
Figure 14C:
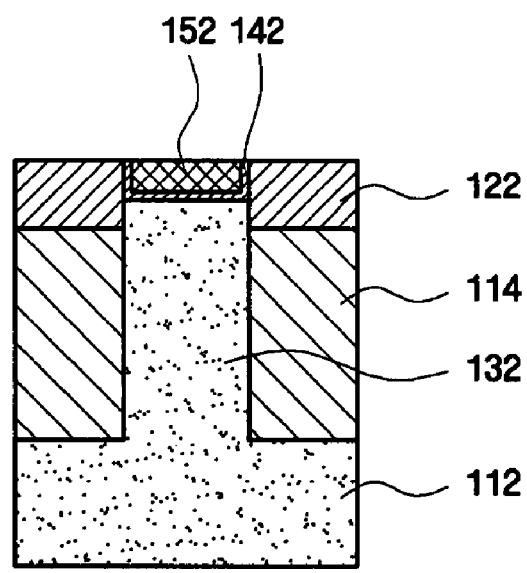

Referring to FIGS. 14A to 14C, the surface of the second passivation material layer 150 and the first passivation material layer 140 is polished to be planarized. The isolation layer 132 may serve as a polishing stop layer. As long as the isolation layer 132 is entirely exposed, it does not matter that a portion of the first passivation material layer 140 remains on the first insulating layer 122. As a result of the planarization, a first passivation layer 142 and a second passivation layer 152 is buried in the first groove 134.

Figure 15A:
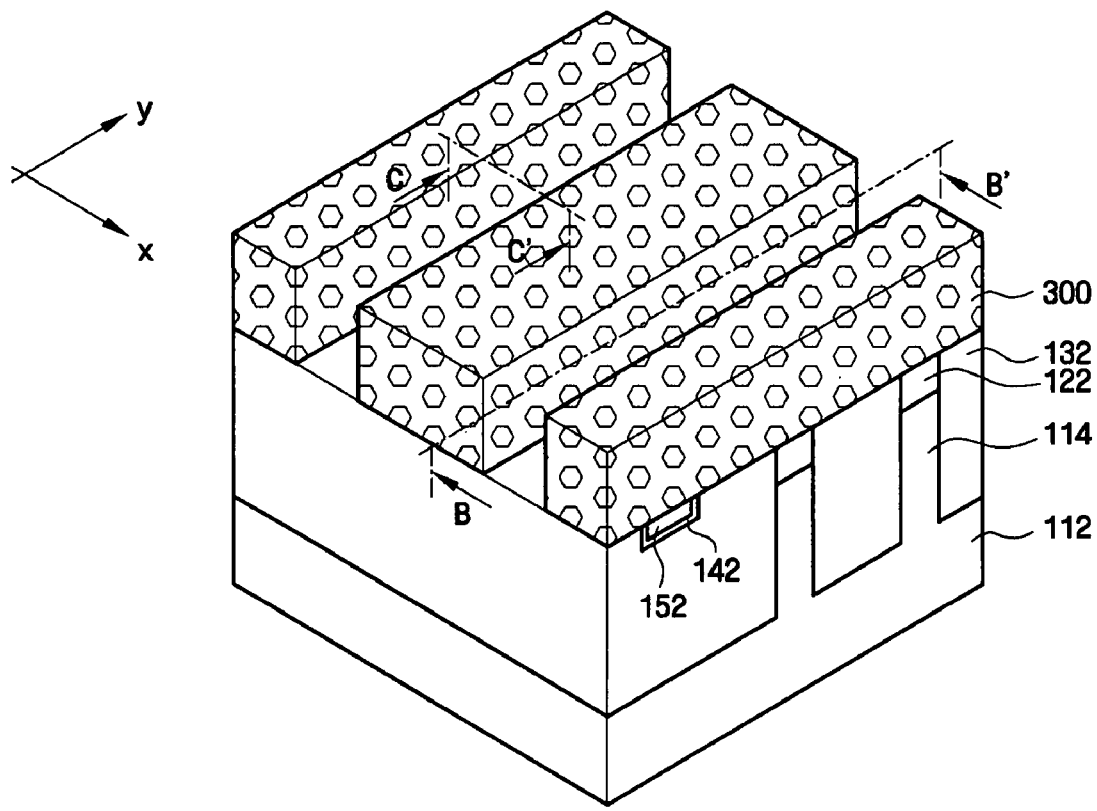
Figure 15B:
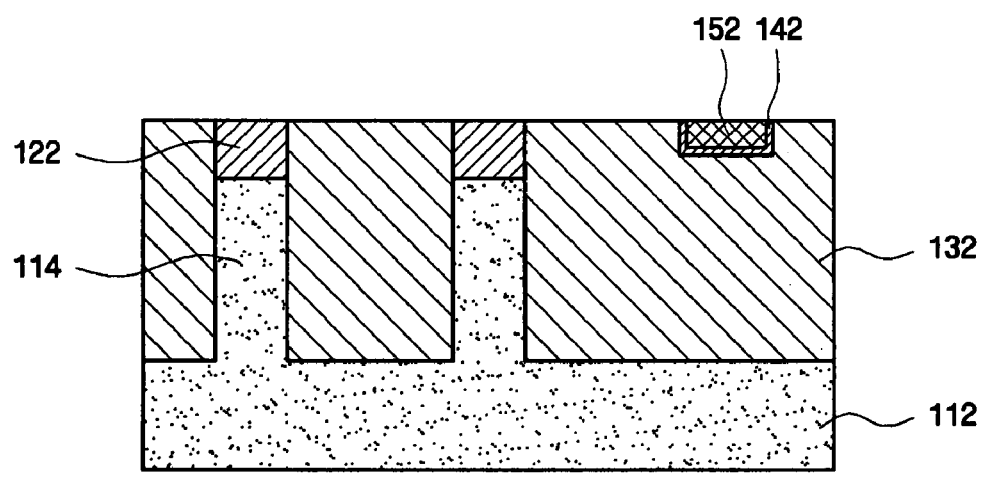
Figure 15C:
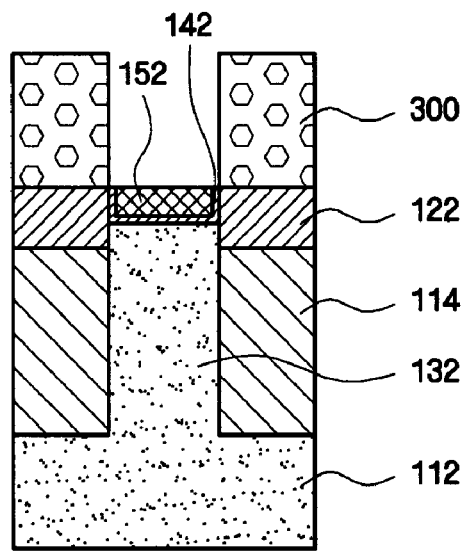

Referring to FIGS. 15A to 15C, a photoresist pattern 300 having an exposed region is formed in a second direction y intersecting a first direction x. This step is substantially identical to the method described with reference to FIGS. 9A to 9C.

Figure 16A:
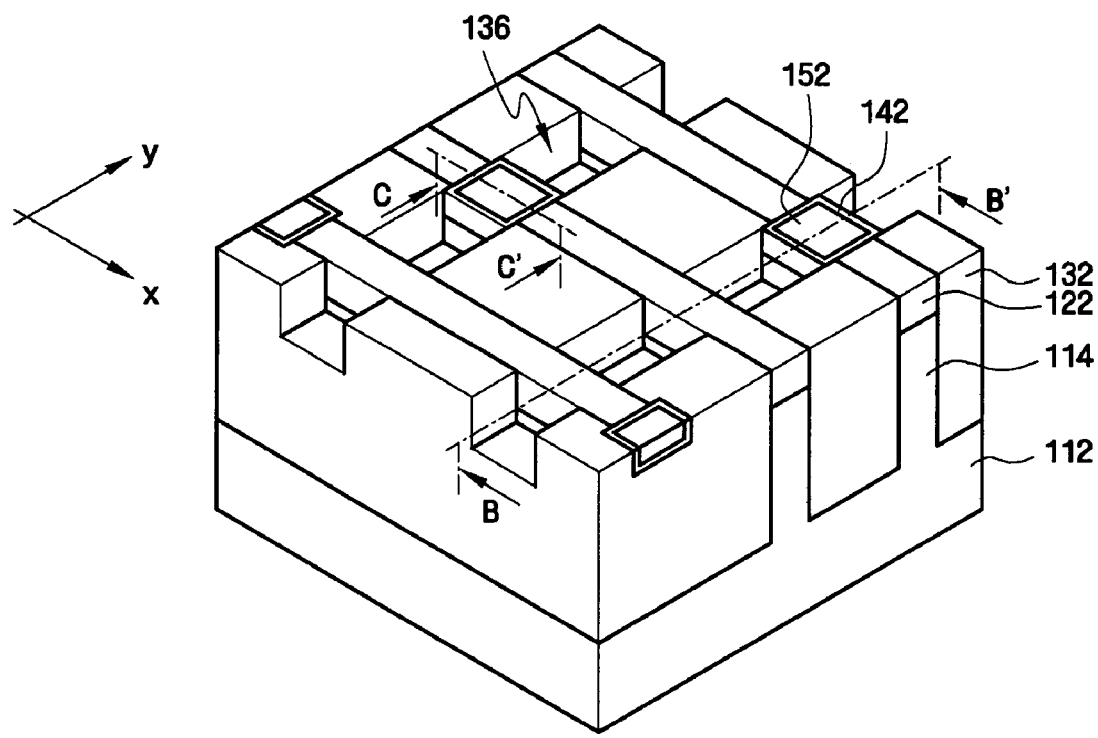
Figure 16B:
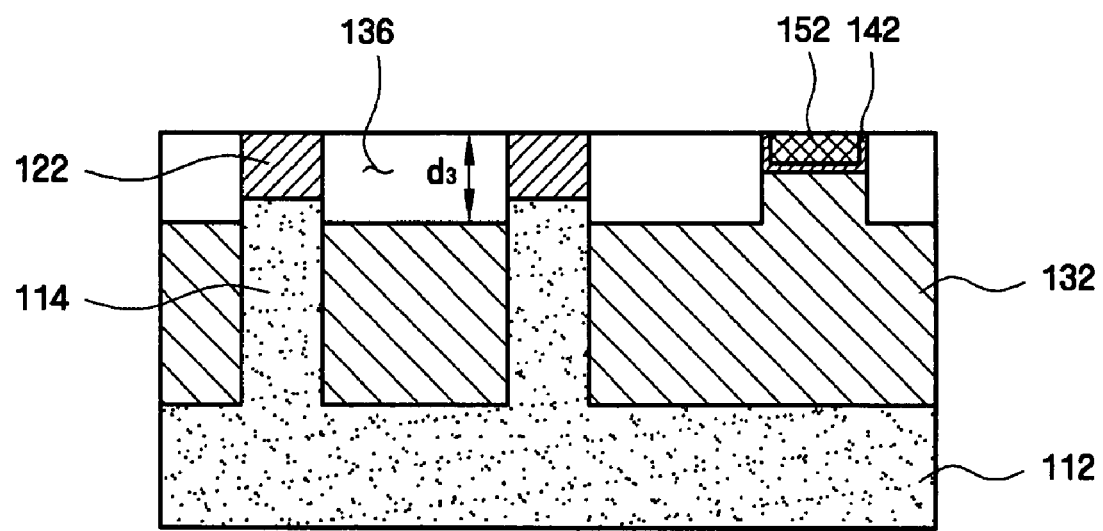
Figure 16C:
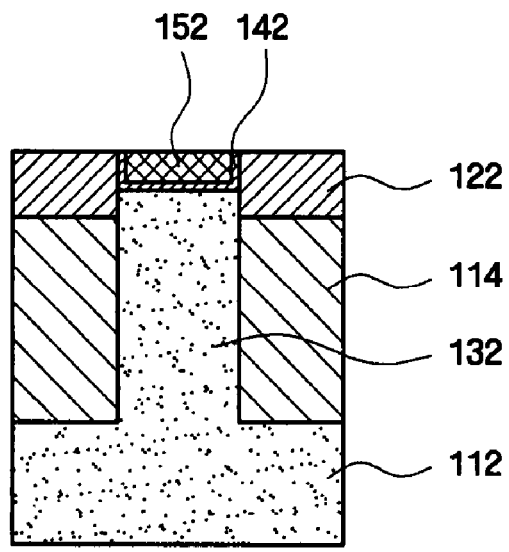

Referring to FIGS. 16A to 16C, a second groove 136 is formed by etching the isolation layer 132 located between active patterns 114 by using the photoresist pattern 300 as the etching mask, an the photoresist pattern 300 is removed. This step is substantially identical to the method described with reference to FIGS. 10A to 10C. However, it is evident that one side of the second groove 136 is formed with the upper second passivation layer 152, first passivation layer 142, and the lower isolation layer 132.

Figure 17A:
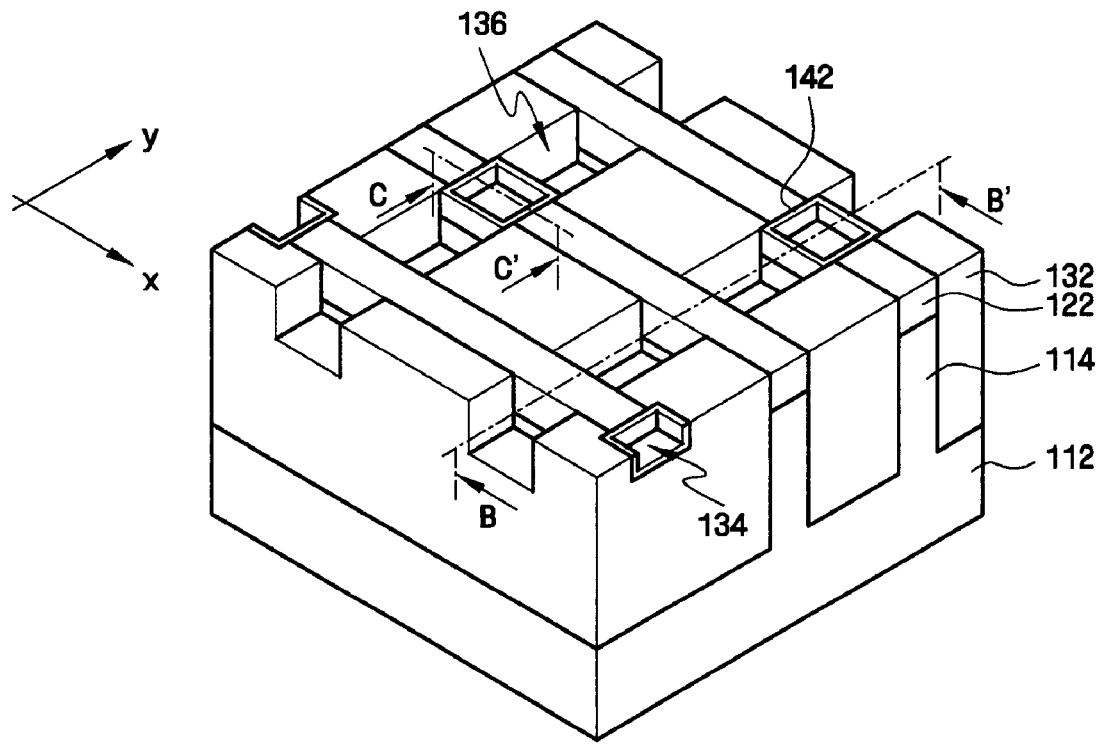
Figure 17B:
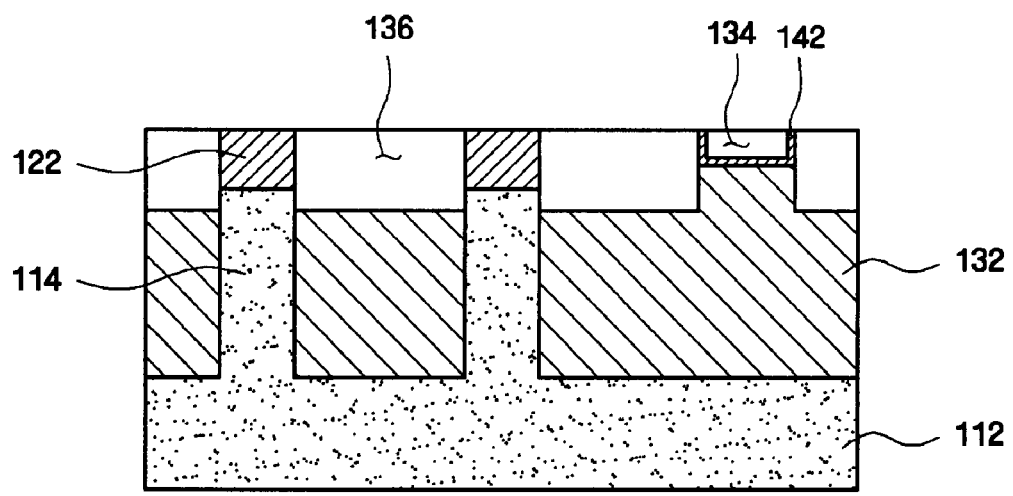
Figure 17C:
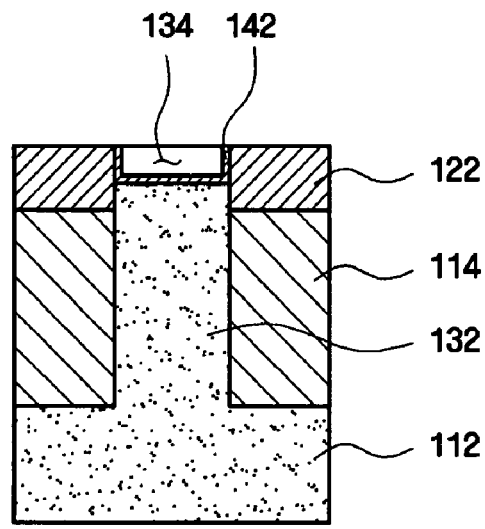

Referring to FIGS. 17A to 17C, the second passivation layer 152 buried in the first groove 134 is removed. This step is substantially identical to the step of FIGS. 11A to 11C. That is, the second passivation layer 152 may be removed by an anisotropic etching and a dry etching or a wet etching after an oxidation layer is formed at the side of the active pattern 114 before the etching. In addition, the second passivation layer 152 may be removed by the dry etching or the wet etching after the photoresist pattern is formed by the etching. Since the first passivation layer 142 remains in the first groove 134 after the removal of the second passivation layer 152 in this embodiment, even though the first groove 134 is formed so as to be deeper than a design depth, a process margin is provided so that the active patterns 114 adjacent to each other are not attacked by an etching gas or etchant. That is, the process margin may be as much as the thickness of the first passivation layer 142.

Figure 18A:
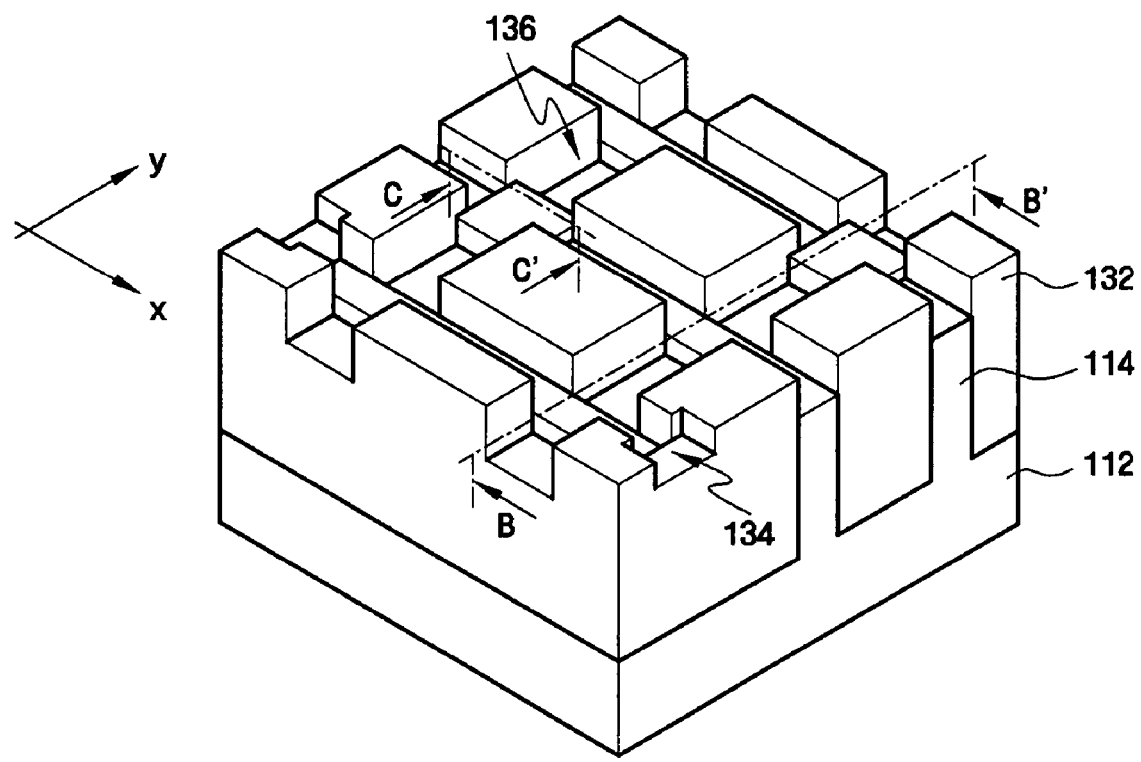
Figure 18B:
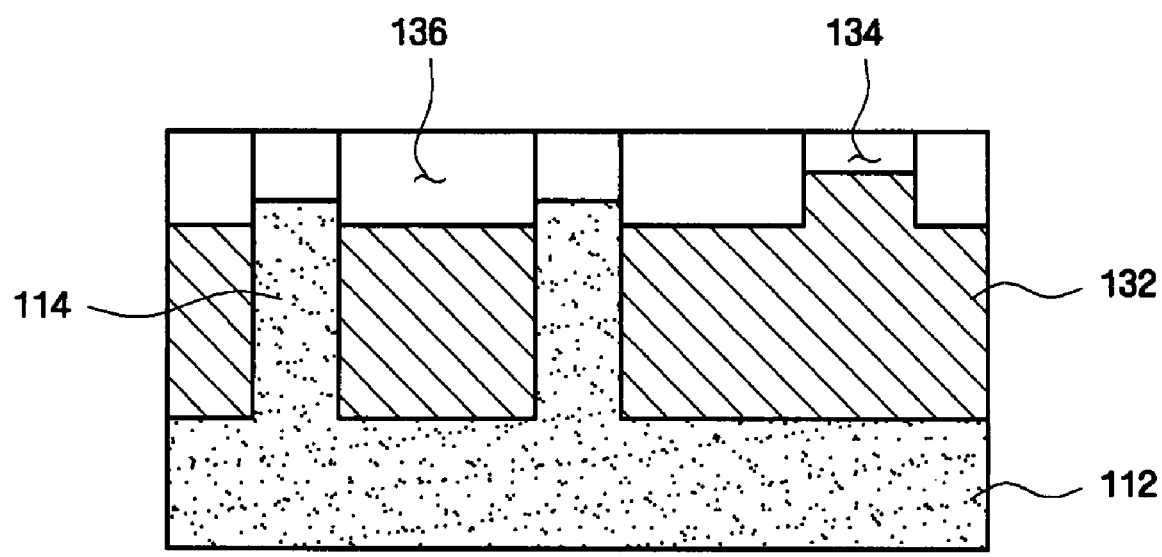
Figure 18C:
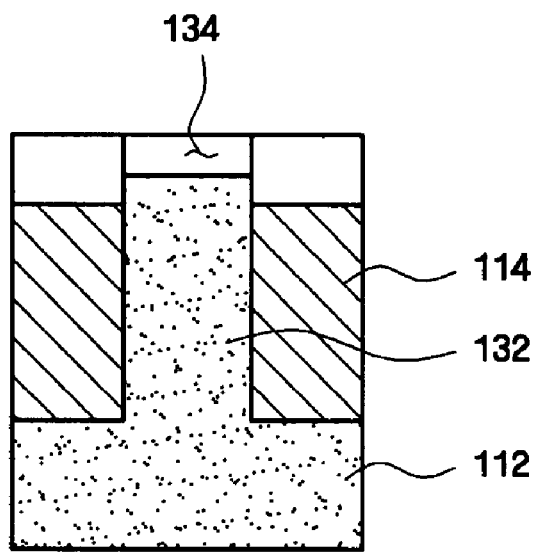

Referring to FIGS. 18A to 18C, the first passivation layer 142 remaining in the first groove 134 and the first insulating layer 122 formed at the surface of the active pattern 114 are removed. If both the first passivation layer 142 and the first insulating layer 122 are formed of the silicon nitride, the first passivation layer 142 and the first insulating layer 122 are removed by one process, thus simplifying the process. The following process is identical to the method described with reference to FIGS. 12A to 12C.

Although the present invention has been described in connection with the exemplary embodiments, it will be apparent to those skilled in the art that various modifications and changes may be made thereto without departing from the scope and spirit of the invention. Therefore, it should be understood that the above embodiments are not limitative, but illustrative in all aspects.

According to the method of fabricating the semiconductor device according to the embodiments of the invention, even though the photo mask or the like is partially misaligned, the device located between the active patterns adjacent to each other is completely separated. Accordingly, the reliability of the device may be improved.

What is claimed is:

1. A method of fabricating a semiconductor device comprising:
providing a semiconductor device having a number of active patterns which extend in a first direction, are separated by an isolation layer, and covered with a first insulating layer;
forming a first groove by etching the isolation layer located between the active patterns adjacent to each other in the first direction;
burying the first groove with a passivation layer;
forming a second groove exposing at least a portion of both sides of the active patterns by etching the isolation layer located between the active patterns in a second direction intersecting with the first direction;
removing the passivation layer in the first groove; and
forming a gate line filling at least a portion of the second groove and extending in the second direction.

2. The method of claim 1, wherein the burying of the first groove with the passivation layer comprises;
forming a passivation material layer on the semiconductor substrate where the first groove is formed; and
polishing the passivation material layer such that the isolation layer and the first insulating layer are exposed.

3. The method of claim 2, wherein the polishing is conducted by using a slurry, in which the passivation material layer has a greater polishing rate than the first insulating layer.

4. The method of claim 3, wherein the passivation material layer includes a polysilicon, an the first insulating layer includes a silicon nitride.

5. The method of claim 2, wherein the depth of the first groove is smaller than the thickness of the first insulating layer.

6. The method of claim 2, wherein the depth of the second groove is larger than the thickness of the first insulating layer.

7. The method of claim 1, wherein the second groove is formed by using a photoresist pattern having an exposed region in the second direction as an etching mask.

8. The method of claim 1, further comprising:
removing the first insulating layer after or at the same time as the removing of the passivation layer.

9. The method of claim 1, wherein the removing of the passivation layer is accomplished by an anisotropic etching.

10. A method of fabricating a semiconductor device comprising:
providing a semiconductor device having a number of active patterns which extend in a first direction, are separated by an isolation layer, and covered with a first insulating layer;
forming a first groove by etching the isolation layer located between the active patterns adjacent to each other in the first direction;
burying the first groove with a first passivation layer and a second passivation layer;
forming a second groove exposing at least a portion of both sides of the active patterns by etching the isolation layer located between the active patterns in a second direction intersecting the first direction;
removing the first passivation layer in the first groove and the second passivation layer in the first groove; and
forming a gate line filling at least a portion of the second groove and extending in the second direction.

11. The method of claim 10, wherein the burying of the first groove with the first passivation layer and the second passivation layer comprises:
forming sequentially a first passivation material layer and a second passivation material layer on the semiconductor substrate where the first groove is formed; and
polishing the second passivation material layer and the first passivation material layer such that the isolation layer and the first insulating layer are exposed.

12. The method of claim 11, wherein the polishing is conducted by using slurry, in which the second passivation layer has a greater polishing rate than the first passivation material layer and the first insulating layer.

13. The method of claim 12, wherein the second passivation material layer includes a polysilicon, and the first passivation material layer and the first insulating layer include a silicon nitride.

14. The method of claim 11, wherein the thickness of the second passivation layer buried in the first groove is larger than that of the first passivation layer.

15. The method of claim 11, wherein the depth of the first groove is smaller than the thickness of the first insulating layer.

16. The method of claim 11, wherein the depth of the second groove is larger than the thickness of the first insulating layer.

17. The method of claim 10, wherein the second groove is formed by using a photoresist pattern having an exposed region in the second direction as an etching mask.

18. The method of claim 10, further comprising:
removing the first insulating layer after or at the same time as the removing of the first passivation layer.

19. The method of claim 12, wherein the removing of the second passivation layer is accomplished by an anisotropic etching.

* * * * *